US012160952B2

(12) United States Patent
Xie et al.

(10) Patent No.: US 12,160,952 B2
(45) Date of Patent: Dec. 3, 2024

(54) PROVIDING A LOWER INDUCTANCE PATH IN A ROUTING SUBSTRATE FOR A CAPACITOR, AND RELATED ELECTRONIC DEVICES AND FABRICATION METHODS

(71) Applicant: QUALCOMM Incorporated, San Diego, CA (US)

(72) Inventors: Biancun Xie, San Diego, CA (US); Shree Krishna Pandey, San Diego, CA (US); Chin-Kwan Kim, San Diego, CA (US); Ryan Lane, San Diego, CA (US); Charles David Paynter, Encinitas, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 196 days.

(21) Appl. No.: 17/934,651

(22) Filed: Sep. 23, 2022

(65) Prior Publication Data

US 2024/0107665 A1    Mar. 28, 2024

(51) Int. Cl.
*H05K 1/00* (2006.01)
*H05K 1/02* (2006.01)
*H05K 3/46* (2006.01)

(52) U.S. Cl.
CPC ......... *H05K 1/0298* (2013.01); *H05K 3/4644* (2013.01); *H05K 2201/093* (2013.01);
(Continued)

(58) Field of Classification Search
CPC ............... H05K 1/0298; H05K 3/4644; H05K 2201/093; H05K 2201/09309; H05K 2201/10015; H05K 2201/10734
See application file for complete search history.

(56) References Cited

U.S. PATENT DOCUMENTS 7,936,568 B2   5/2011  Mashino
8,054,630 B2   11/2011 Questad et al.
(Continued)

FOREIGN PATENT DOCUMENTS

JP    2009170941 A    7/2009
WO   2016100829 A2   6/2016

OTHER PUBLICATIONS

Andresakis, J. et al., "Substrate with Combined Embedded Capacitance and Resistance for Better Electrical Performance and Higher Integration," Electronic Components and Technology Conference (CARTS), Apr. 2006, Orlando, FL, 9 pages.

(Continued)

*Primary Examiner* — Pete T Lee
(74) *Attorney, Agent, or Firm* — Withrow & Terranova, PLLC

(57) ABSTRACT

Electronic devices that include a routing substrate with lower inductance path for a capacitor, and related fabrication methods. In exemplary aspects, to provide lower interconnect inductance for a capacitor coupled to a power distribution network in the routing substrate, an additional metal layer that provides an additional, second power plane is disposed in a dielectric layer between adjacent metal layers in adjacent metallization layers. The additional, second power plane is adjacent to a first power plane disposed in a first metal layer of one of the adjacent metallization layers. The disposing of the additional metal layer in the dielectric layer of the metallization layer reduces the thickness of the dielectric material between the first and second power planes coupled to the capacitor as part of the power distribution network. This reduced dielectric thickness between first and second power planes coupled to the capacitor reduces the interconnect inductance for the capacitor.

28 Claims, 17 Drawing Sheets

(52) U.S. Cl.
CPC ............ *H05K 2201/09309* (2013.01); *H05K 2201/10015* (2013.01); *H05K 2201/10734* (2013.01)

(56) References Cited

U.S. PATENT DOCUMENTS

| | | | | |
|---|---|---|---|---|
| 11,658,106 | B2* | 5/2023 | Kawai | H01L 23/642 361/768 |
| 11,749,597 | B2* | 9/2023 | Oikawa | H01L 23/5223 257/532 |
| 11,804,382 | B2* | 10/2023 | Williamson | H01L 23/642 |
| 2002/0071256 | A1* | 6/2002 | Figueroa | H01L 23/5383 257/E23.079 |
| 2005/0218502 | A1* | 10/2005 | Sunohara | H01L 23/50 257/E23.079 |
| 2012/0020042 | A1 | 1/2012 | Gruendler et al. | |
| 2019/0341356 | A1* | 11/2019 | Chung | H01L 23/562 |
| 2020/0344894 | A1* | 10/2020 | Liu | H05K 3/4038 |
| 2022/0384308 | A1* | 12/2022 | Lee | H01L 23/49833 |

OTHER PUBLICATIONS

Lu, J. et al., "Recent Advances in High-k Nanocomposite Materials for Embedded Capacitor Applications," IEEE Transactions on Dielectrics and Electrical Insulation, vol. 15, Issue 5, Oct. 2008, IEEE, pp. 1322-1328.
International Search Report and Written Opinion for International Patent Application No. PCT/US2023/074332, mailed Jan. 16, 2024, 16 pages.

\* cited by examiner

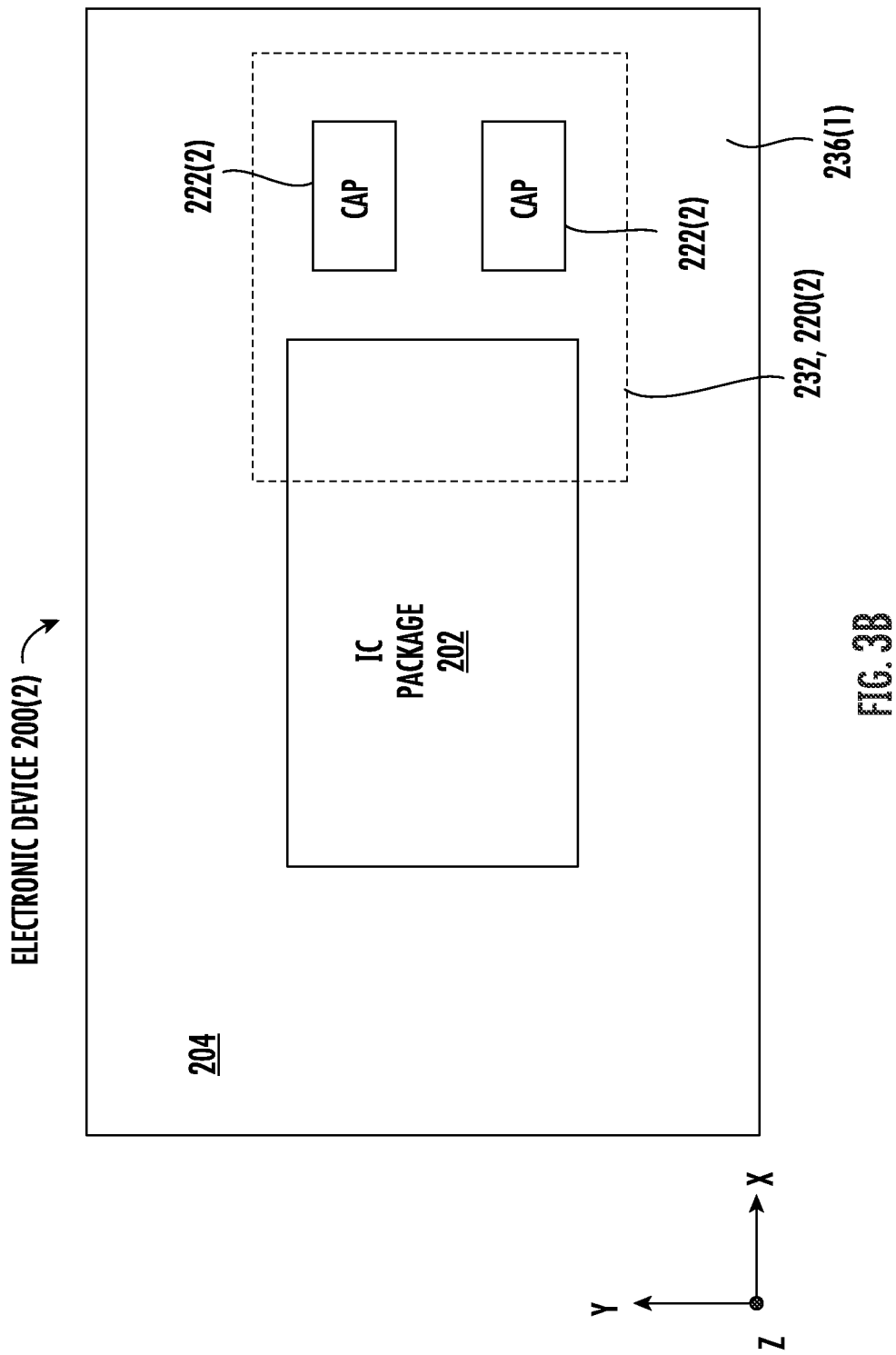

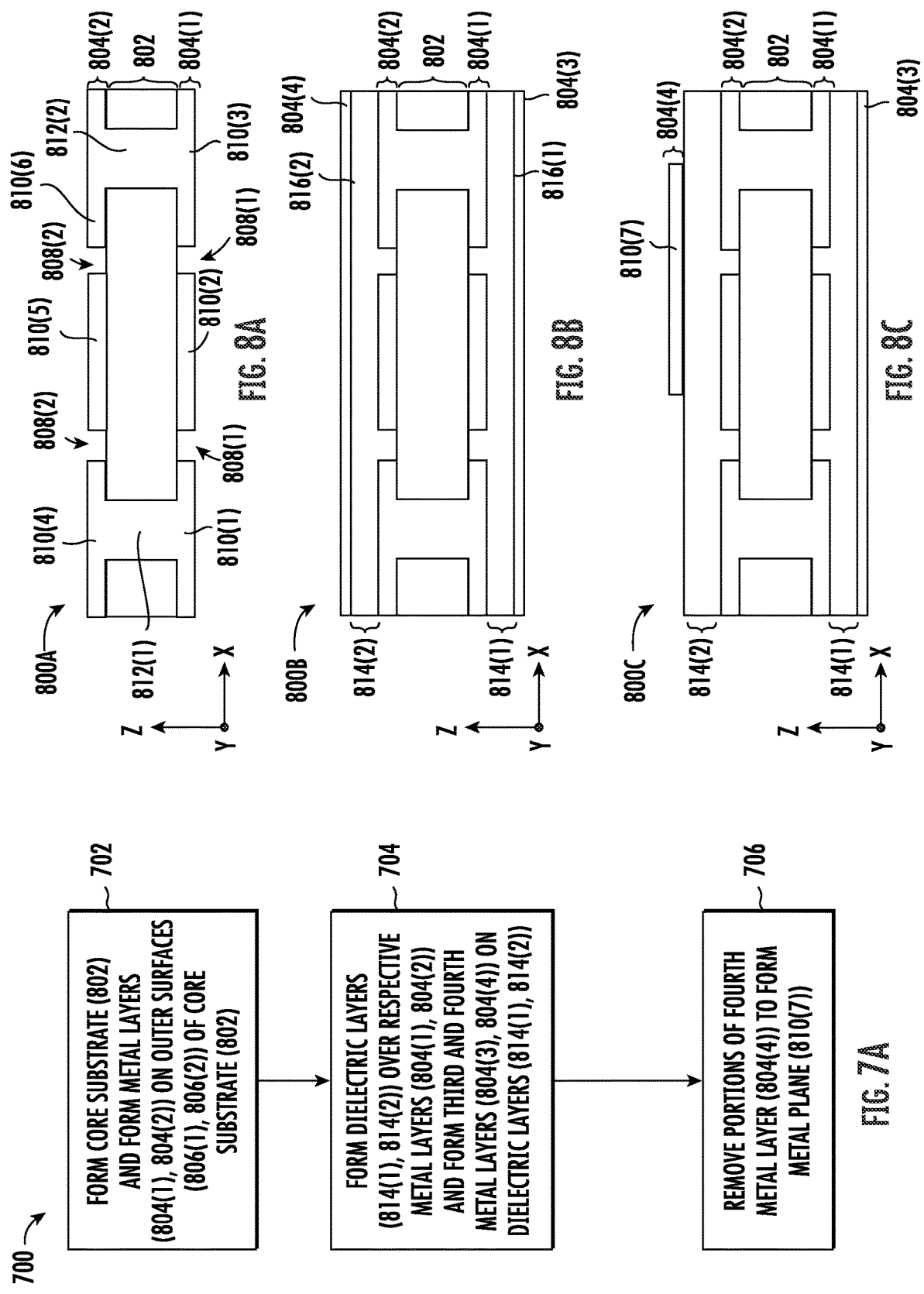

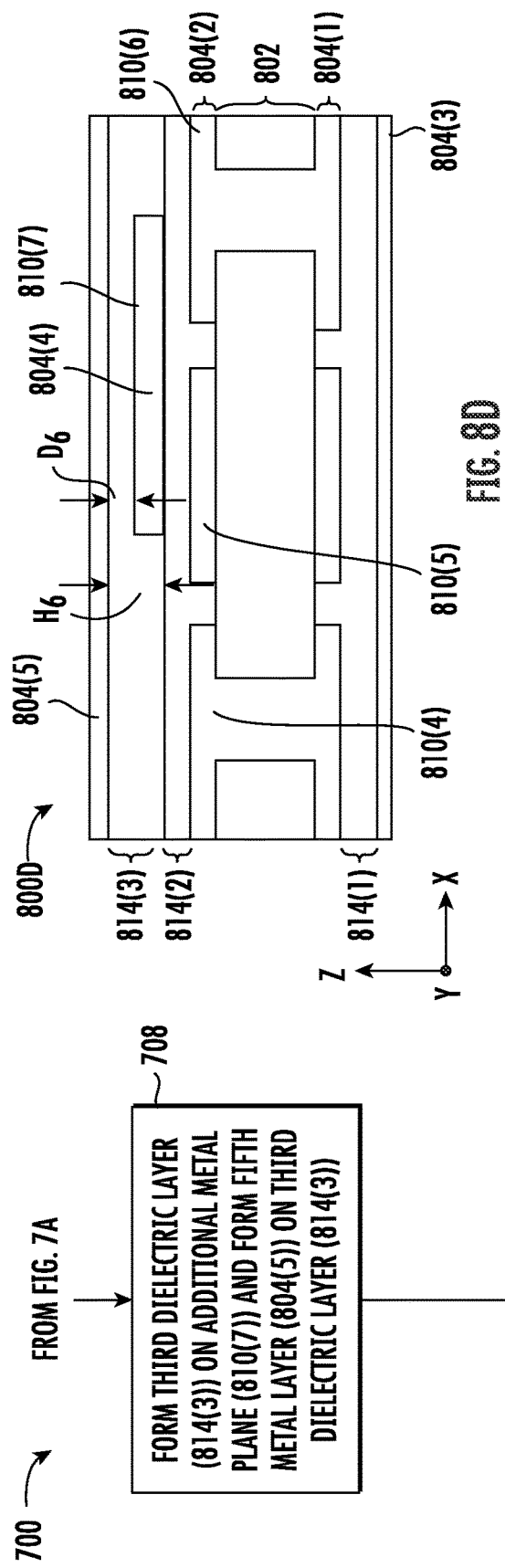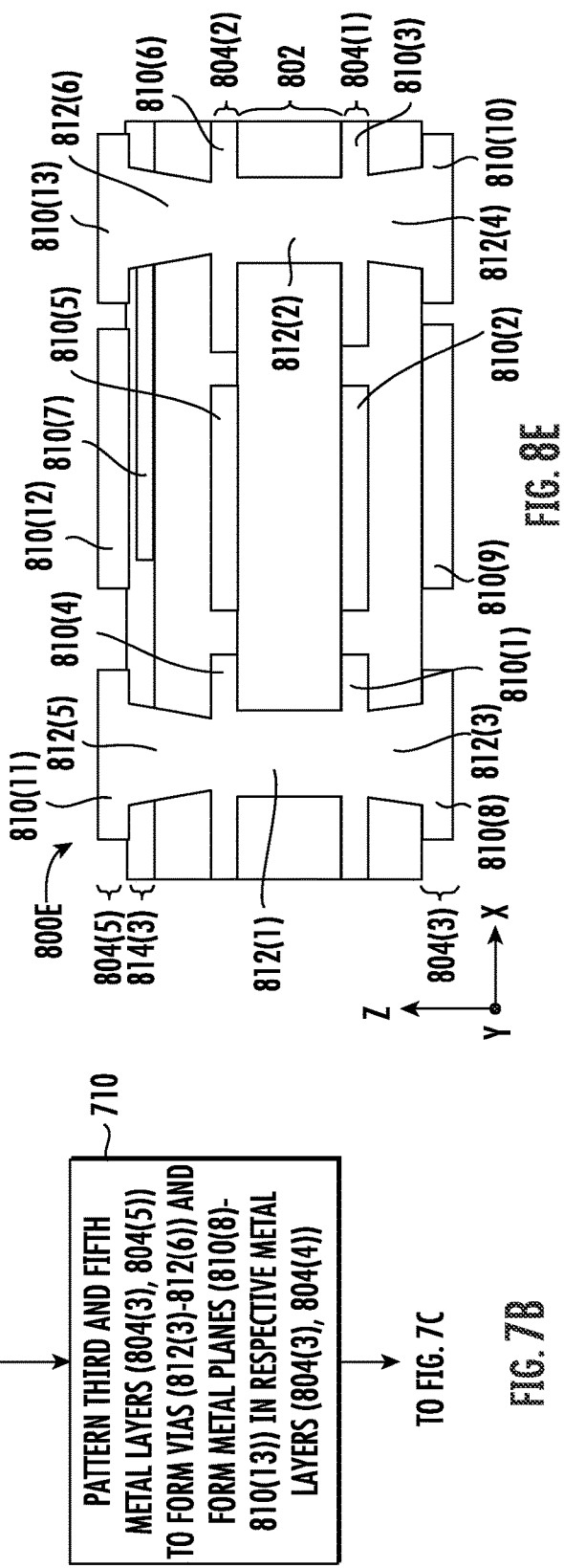

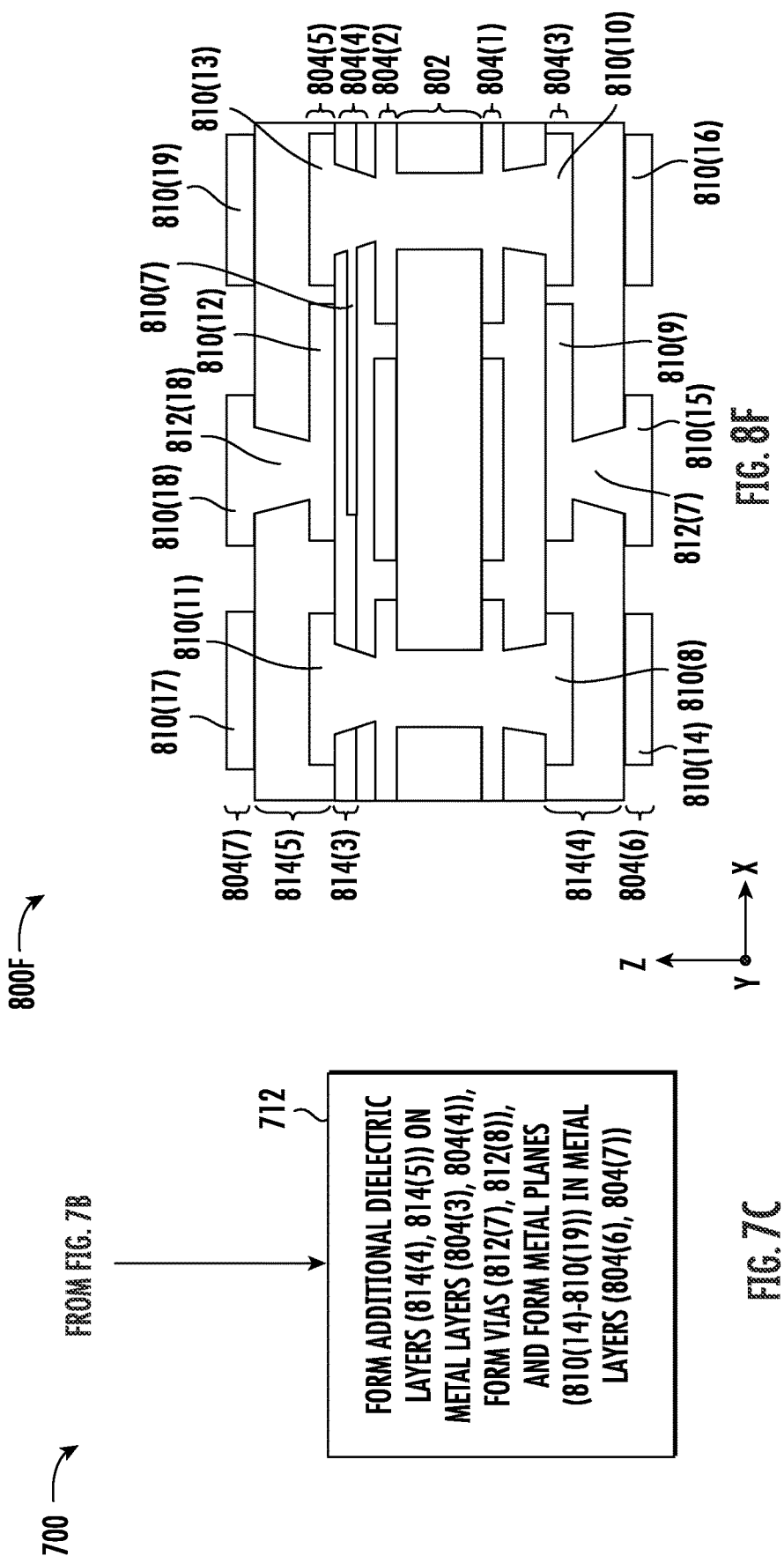

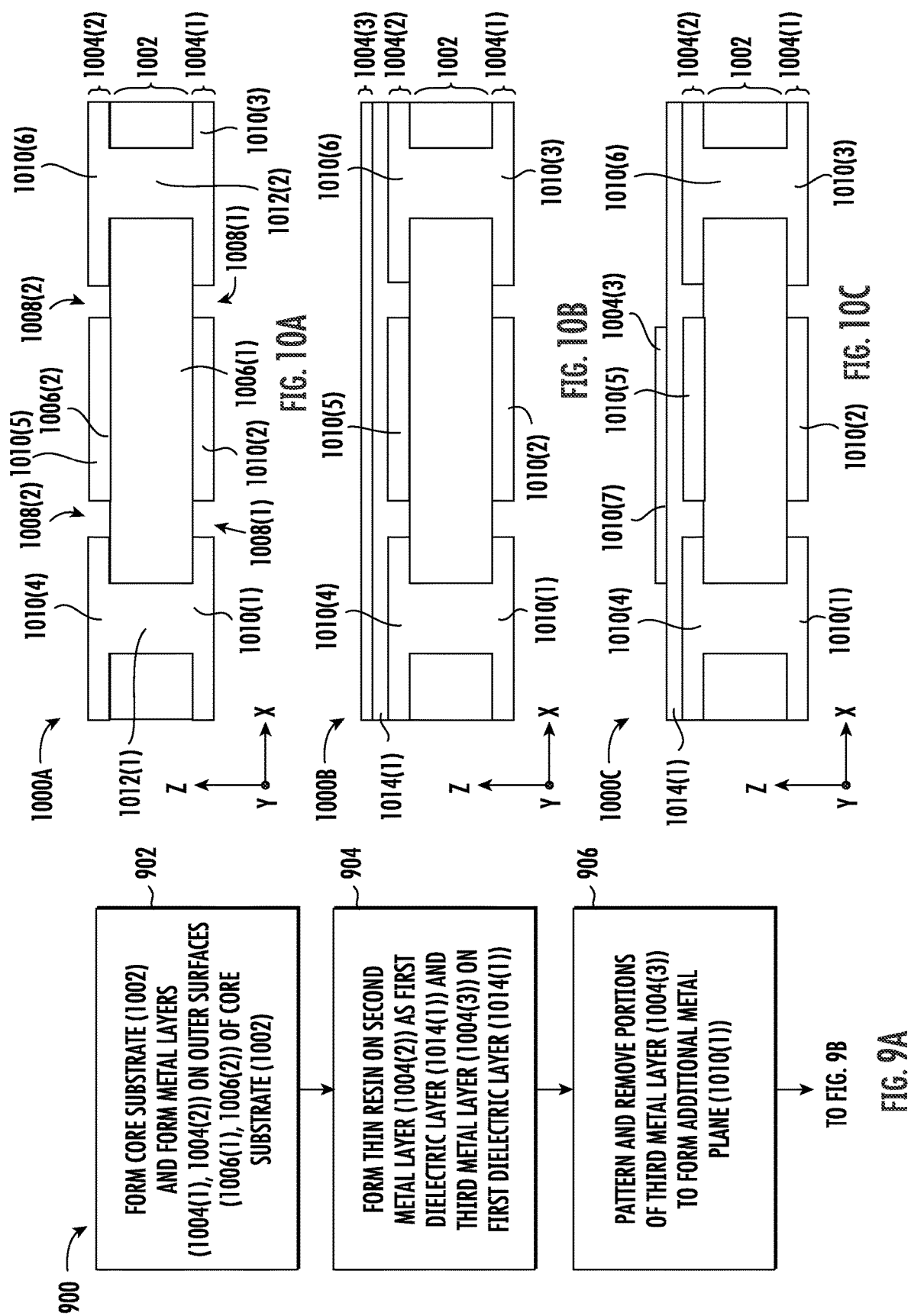

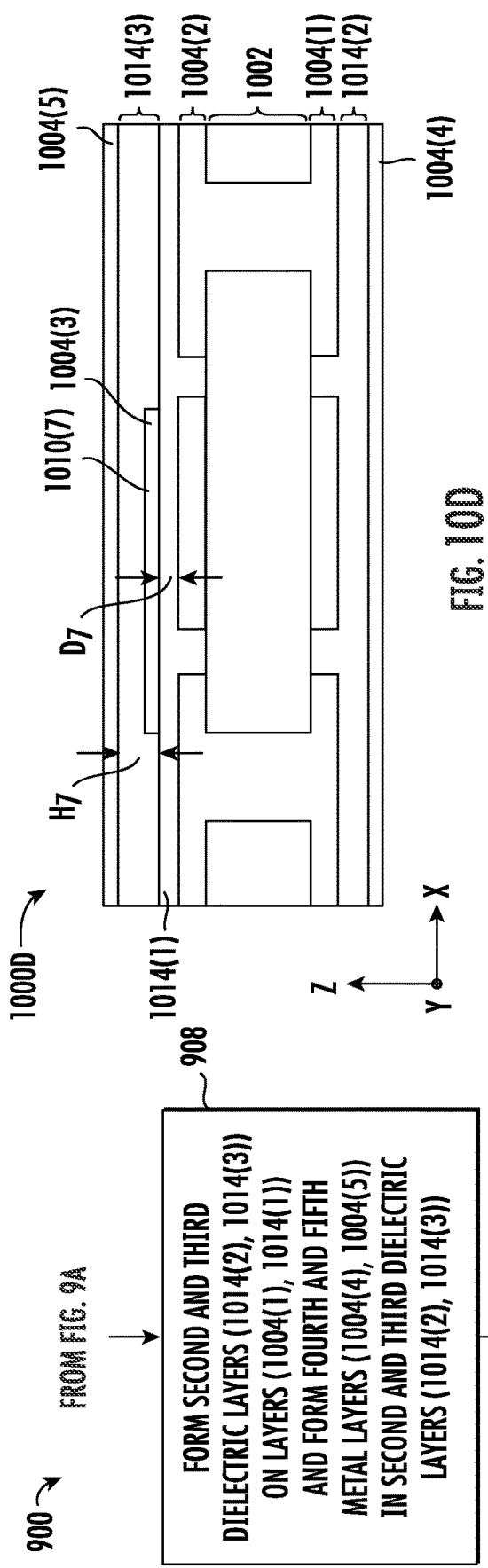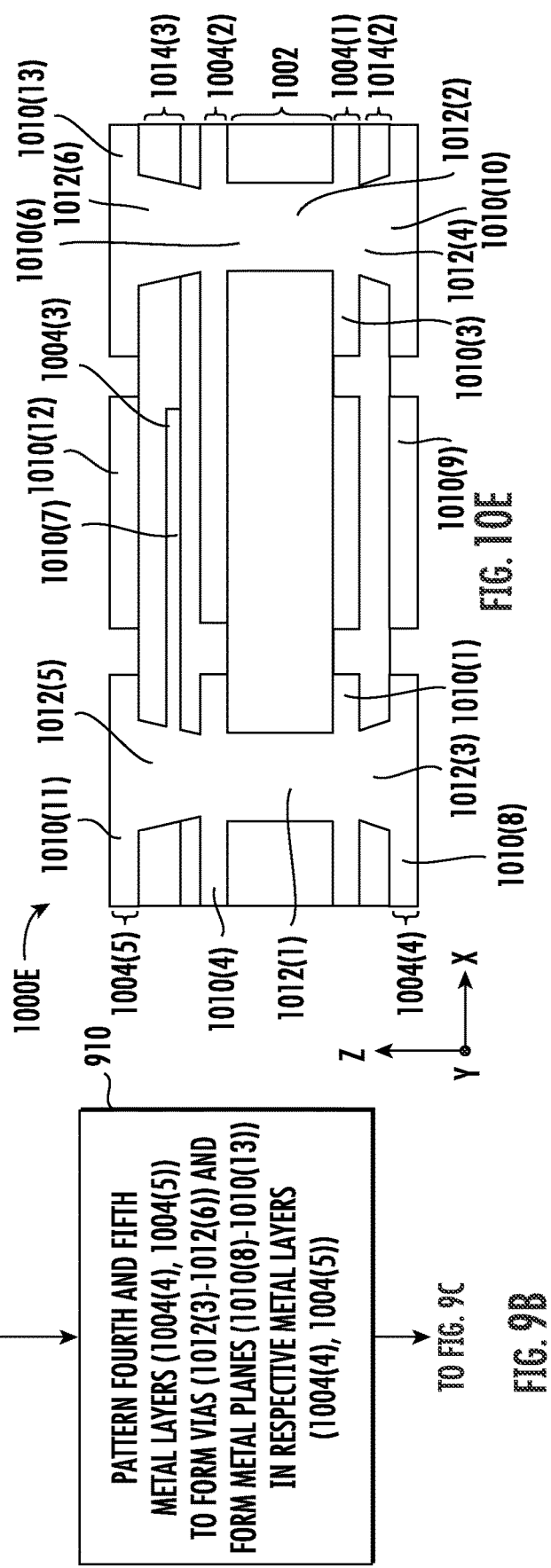

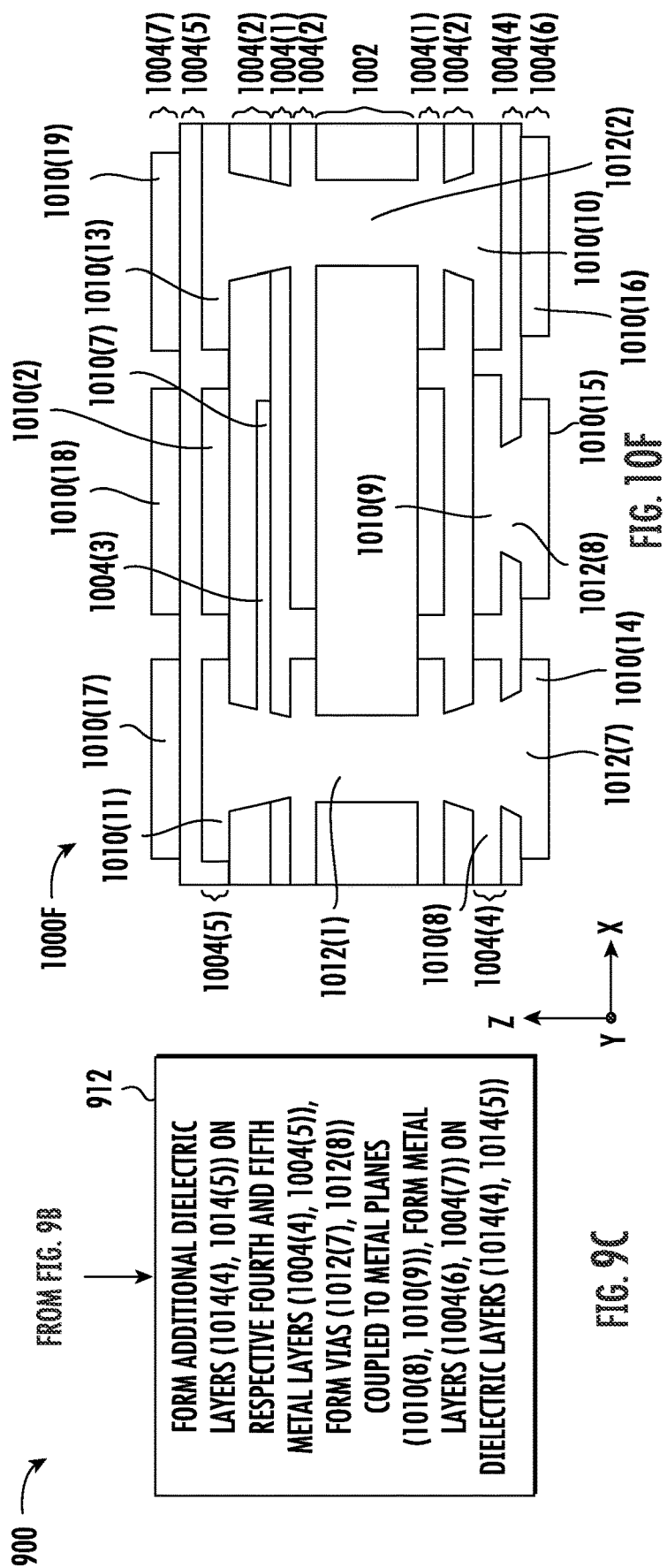

PROVIDING A LOWER INDUCTANCE PATH IN A ROUTING SUBSTRATE FOR A CAPACITOR, AND RELATED ELECTRONIC DEVICES AND FABRICATION METHODS

BACKGROUND

I. Field of the Disclosure

The field of the disclosure relates to integrated circuit (IC) packages that include one or more semiconductor dies supported by a package substrate, and more particularly to coupling of capacitors to a die in the IC package to support signal processing and/or power integrity.

II. Background

Integrated circuits (ICs) are the cornerstone of electronic devices. ICs are packaged in an IC package, also called a "semiconductor package" or "chip package." The IC package includes one or more semiconductor dice ("dies" or "dice") that are mounted on and electrically coupled to a package substrate to provide physical support and an electrical interface to the die(s). The IC package may be coupled to a printed circuit board (PCB) to interface the circuits in the IC package to other electrical components coupled to the PCB. The IC package may also be coupled to power and ground rail(s) within a power distribution network in the PCB to receive power for operation. For example, the PCB may include external interconnects that are configured to be coupled to a power source to receive power signal that are distributed in its the power distribution network to be supplied to the IC package.

It is common to couple capacitors to circuits in IC packages. Capacitors may be coupled to circuits in an IC package as part of a filtering circuit for a die in the IC package. Capacitors may also be coupled to circuits in an IC package to provide a decoupling capacitance for circuits in a die in the IC package to shunt noise from one electrical circuit (e.g., a power supply circuit) to another electrical circuit (e.g., a powered electrical circuit). For example, to provide a decoupling capacitance for an IC package, a decoupling capacitor(s) may be coupled to the package substrate of the IC package or the same PCB to which the IC package is coupled. The decoupling capacitor(s) can be coupled to an outer surface of the package substrate or PCB such that the decoupling capacitor(s) is electrically coupled to the power and ground rail(s) of the power distribution network in the package substrate or PCB. For example, a decoupling capacitor(s) can be coupled to the same side (i.e., package side) of the PCB in which the IC package is coupled. A decoupling capacitor(s) can also be coupled to the opposite side of the PCB (i.e., land side) to which the IC package is coupled. In either case of a package side or land side capacitor, it is desired to minimize the signal routing path length between die in the IC package and capacitor. This is because inductance in the connection path increases as a function of increased signal routing path length. An increased inductance can result in a loss of performance of the capacitor. The signal routing path length between the capacitor and die in an IC package may be further increased if the capacitor cannot be mounted to a package substrate or PCB vertically aligned underneath the IC package (i.e., mounted to the package substrate or PCB laterally offset from the die). Mounting of the capacitor to a package substrate or PCB laterally offset from the die means that the signal routing path between the capacitor and the die will also include horizontal routing paths within the package substrate or PCB, thus contributing to an increased signal routing path length.

SUMMARY OF THE DISCLOSURE

Aspects disclosed herein include providing a lower inductance path in a routing substrate for a capacitor. Related electronic devices and fabrication methods are also disclosed. As one example, the routing substrate can be a package substrate of an integrated circuit (IC) package. As another example, the routing substrate can be a circuit board (e.g., a printed circuit board (PCB)) in which an IC chip or other IC package is coupled to provide electrical signal routing between the PCB and the IC chip/IC package. The routing substrate includes one or more metallization layers that each include a metal layer insulated by a dielectric layer. A capacitor is coupled to the routing substrate and can be electrically coupled to the planes ("power planes") in metal layers in metallization layers of the routing substrate to provide a decoupling capacitance. The thickness of the dielectric layer between metal layers in the adjacent metallization layers affects the interconnect inductance of a device (e.g., a capacitor) coupled to power planes in such adjacent metal layers, because there is a flux loop created between the adjacent metal layers when power signals are carried in power planes in the adjacent metal layers. The greater the thickness of the dielectric layer between the adjacent metal layers, the larger the interconnect inductance between those adjacent metal layers. For example, an increased interconnect inductance can result in a loss of performance of a capacitor coupled to such power planes. Thus, in exemplary aspects, to provide lower interconnect inductance in the power distribution network in the routing substrate, an additional metal plane to provide a second power plane is disposed in a dielectric layer between adjacent metal layers in the adjacent metallization layers. A first power plane is disposed in a metal layer in one of the adjacent metallization layers. The disposing of the second power plane in the dielectric layer between adjacent metal layers in adjacent metallization layers reduces the thickness of the dielectric material of the dielectric layer between the first and second power planes. This reduced dielectric thickness between the first and second power planes can reduce the interconnect inductance for the capacitor coupled to the first and second power planes.

As one example, the additional metal plane as the additional, second power plane can be a separate added metal plane in a dielectric layer between adjacent metal layers in the adjacent metallization layers. This reduces the thickness between the first and second power planes to reduce interconnect inductance between the first and second power planes. In another example, the additional metal plane as the additional, second power plane can be disposed in one of the metal layers of the adjacent metallization layers and increased in thickness to be at least partially disposed in the dielectric layer between the adjacent metal layers in the adjacent metallization layers. In this example, this also reduces the thickness between first and second power planes to reduce interconnect inductance between the first and second power planes.

Providing of the additional metal plane in a metallization layer of the routing substrate as an additional, second power plane to reduce the thickness of the dielectric material between the first and second power planes may be particularly advantageous when signal routing paths to a coupled capacitor require horizontal routing paths in the routing substrate. This is because circuit board or package substrate fabrication limitations may impose or require a minimum distance between metallization layers in a routing substrate that controls a minimum dielectric layer thickness between adjacent metallization layers. Providing of the additional metal plane as an additional, second power plane for a coupled capacitor to reduce interconnect inductance to the capacitor may allow more flexibility in placement of the capacitor on the circuit board or package substrate. For example, the capacitor may be able to be placed in the circuit board or package substrate in an area that would require horizontal routing between the capacitor and the IC package or circuit that would otherwise have an increased interconnect inductance to the capacitor due to the longer signal routing paths due to horizontal routing. For example, it may be easier to place a capacitor on the circuit board or package substrate that requires horizontal signal routing rather than placing the capacitor on the circuit board or package substrate that would allow for vertical signal routing.

In one exemplary aspect, the routing substrate is a circuit board (e.g., a printed circuit board (PCB)). In one example, the IC package includes one or more dies coupled to the circuit board, wherein the dies are indirectly electrically coupled to the circuit board. In another example, a die(s) is directly coupled to the circuit board. A capacitor is also coupled to the circuit board and coupled a first power plane in a first metal layer of a first metallization layer and the additional metal plane as the additional, second power plane with a reduced dielectric material thickness therebetween, to provide a de-coupling capacitance to an IC package or die coupled to the circuit board. The capacitor can be a package side capacitor coupled to an outer surface of the circuit board on the same side of the circuit board as the IC package or die is coupled. The capacitor could also be a land side capacitor (LSC) coupled to an outer surface of the circuit board on the opposite side of the circuit board as the IC package or die is coupled. The reduced interconnect inductance to the capacitor facilitated by the additional metal plane can mitigate or offset any increased inductance caused by longer signal routing paths provided to the capacitor. This provides additional flexibility in coupling the capacitor to the circuit board that takes advantage of available space and/or avoids the need to increase the overall height of the IC package/die and the circuit board. Additional capacitors may also be coupled to the circuit board that are aligned vertically to the IC package or a die that only require vertical signal routing paths between the additional capacitor and the IC package or die.

In another exemplary aspect, the routing substrate is a package substrate of an IC package. A capacitor is also coupled to the package substrate and coupled to a first power plane in a first metal layer of a first metallization layer and the additional metal plane as an additional, second power plane with a reduced dielectric material thickness therebetween, to provide a de-coupling capacitance to a die coupled to the package substrate. The capacitor can be a package side capacitor coupled to an outer surface of the package substrate on the same side of the package substrate to which the die is coupled. The capacitor could also be an LSC coupled to an outer surface of the package substrate on the opposite side of the package substrate to which the die is coupled. The reduced interconnect inductance to the capacitor facilitated by the additional metal plane can mitigate or offset any increased inductance caused by longer signal routing paths provided to the capacitor. This provides additional flexibility in coupling the capacitor to the package substrate that takes advantage of available space and/or avoids the need to increase the overall height of the IC package. Additional capacitors may also be coupled to the package that are aligned vertically to a die that only require vertical signal routing paths between the additional capacitor and the die.

In this regard, in one exemplary aspect, an electronic device is provided. The electronic device comprises a routing substrate comprising a plurality of metallization layers parallel to each other in a first direction. The plurality of metallization layers comprises a first metallization layer comprising a first metal layer comprising a first metal plane, and a first dielectric layer adjacent to the first metal layer. The plurality of metallization layers also comprises a second metallization layer adjacent to the first metallization layer. The second metallization layer comprises a second metal layer and a second dielectric layer adjacent to the second metal layer. The routing substrate also comprises a second metal plane disposed in the first dielectric layer in the first direction between the first metal layer and the second metal layer. The electronic device also comprises a capacitor coupled to the first metal plane and the second metal plane.

In another exemplary aspect, a method of fabricating an electronic device is provided. The method comprises forming a routing substrate comprising a plurality of metallization layers parallel to each other in a first direction, comprising forming a first metallization layer and forming a second metallization layer. Forming the first metallization layer comprises forming a first metal layer comprising a first metal plane, and forming a first dielectric layer adjacent to the first metal layer. For the second metallization layer comprises forming a second metal layer and forming a second dielectric layer adjacent to the second metal layer. Forming the routing substrate comprising a plurality of metallization layers also comprises forming a second metal plane in the first dielectric layer of the first metallization layer. Forming the routing substrate also comprises coupling the second metallization layer to the first metallization layer such that the second metal plane is between the first metal layer and the second metal layer in a second direction orthogonal to the first direction. The method also comprises coupling a capacitor to the routing substrate comprising coupling the capacitor to the first metal plane and the second metal plane.

BRIEF DESCRIPTION OF THE FIGURES

FIGS. 3A-3C are top views of exemplary layouts of the electronic device in FIG. 2, illustrating an additional power plane provided by the additional metal plane disposed in a dielectric layer of a metallization layer of the circuit board, and possible locations of capacitors coupled to the PCB and the power plane;

FIG. 7A-7C is a flowchart illustrating another exemplary process of fabricating a routing substrate for an electronic device, wherein the routing substrate includes a metal layer as a first power plane in a first metallization layer of the circuit board, and an additional metal plane as a second, additional power plane disposed in a dielectric layer of an adjacent, second metallization layer, to reduce the thickness of the dielectric material between the first and additional power planes, to reduce interconnect inductance, including but not limited to the routing substrates in FIGS. 2A-5;

FIGS. 8A-8F are exemplary fabrication stages during fabrication of a routing substrate according to the exemplary fabrication process in FIGS. 7A-7C;

FIG. 9A-9C is a flowchart illustrating another exemplary process of fabricating a routing substrate for an electronic device, wherein the routing substrate includes a metal layer as a first power plane in a first metallization layer of the circuit board, and an additional metal plane as a second, additional power plane disposed in a dielectric layer of an adjacent, second metallization layer, to reduce the thickness of the dielectric material between the first and additional power planes, to reduce interconnect inductance, including but not limited to the routing substrates in FIGS. 2A-5;

FIGS. 10A-10F are exemplary fabrication stages during fabrication of a routing substrate according to the exemplary fabrication process in FIGS. 9A-9C;

DETAILED DESCRIPTION

Figure 1:
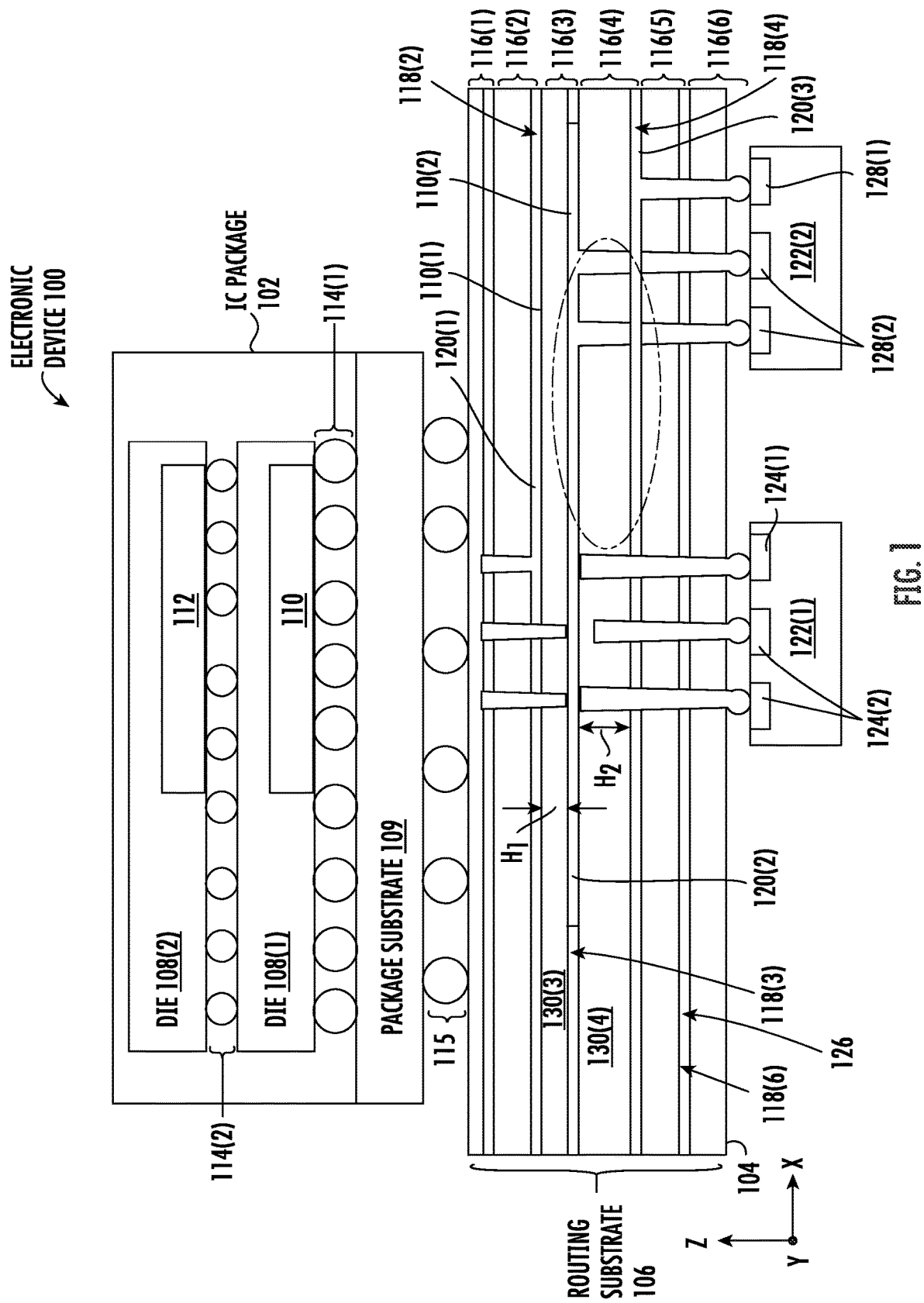
FIG. 1 is a side view of an electronic device that includes an integrated circuit (IC) package coupled to a circuit board as a routing substrate, and capacitors coupled to the circuit board and electrically coupled to power planes in adjacent metallization layers within the circuit board to provide a decoupling capacitance.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include providing a lower inductance path in a routing substrate for a capacitor. Related electronic devices and fabrication methods are also disclosed. As one example, the routing substrate can be a package substrate of an integrated circuit (IC) package. As another example, the routing substrate can be a circuit board (e.g., a printed circuit board (PCB)) in which an IC chip or other IC package is coupled to provide electrical signal routing between the PCB and the IC chip/IC package. The routing substrate includes one or more metallization layers that each include a metal layer insulated by a dielectric layer. A capacitor is coupled to the routing substrate and can be electrically coupled to the planes ("power planes") in metal layers in metallization layers of the routing substrate to provide a decoupling capacitance. The thickness of the dielectric layer between metal layers in the adjacent metallization layers affects the interconnect inductance of a device (e.g., a capacitor) coupled to power planes in such adjacent metal layers, because there is a flux loop created between the adjacent metal layers when power signals are carried in power planes in the adjacent metal layers. The greater the thickness of the dielectric layer between the adjacent metal layers, the larger the interconnect inductance between those adjacent metal layers. For example, an increased interconnect inductance can result in a loss of performance of a capacitor coupled to such power planes. Thus, in exemplary aspects, to provide lower interconnect inductance in the power distribution network in the routing substrate, an additional metal plane to provide a second power plane is disposed in a dielectric layer between adjacent metal layers in the adjacent metallization layers. A first power plane is disposed in a metal layer in one of the adjacent metallization layers. The disposing of the second power plane in the dielectric layer between adjacent metal layers in adjacent metallization layers reduces the thickness of the dielectric material of the dielectric layer between the first and second power planes. This reduced dielectric thickness between the first and second power planes can reduce the interconnect inductance for the capacitor coupled to the first and second power planes.

Providing of the additional metal plane in a metallization layer of the routing substrate as an additional, second power plane to reduce the thickness of the dielectric material between the first and second power planes may be particularly advantageous when signal routing paths to a coupled capacitor require horizontal routing paths in the routing substrate. This is because circuit board or package substrate fabrication limitations may impose or require a minimum distance between metallization layers in a routing substrate that controls a minimum dielectric layer thickness between adjacent metallization layers. Providing of the additional metal plane as an additional, second power plane for a coupled capacitor to reduce interconnect inductance to the capacitor may allow more flexibility in placement of the capacitor on the circuit board or package substrate. For example, the capacitor may be able to be placed in the circuit board or package substrate in an area that would require horizontal routing between the capacitor and the IC package or circuit that would otherwise have an increased interconnect inductance to the capacitor due to the longer signal routing paths due to horizontal routing. For example, it may be easier to place a capacitor on the circuit board or package substrate that requires horizontal signal routing rather than placing the capacitor on the circuit board or package substrate that would allow for vertical signal routing.

Before discussing examples of electronic devices that include a capacitor coupled to a first power plane in a first metallization layer in a routing substrate, and coupled to an additional metal plane as an additional, second power plane disposed in a dielectric layer of an adjacent, second metallization layer, to reduce the thickness of the dielectric material between the first and second power planes to reduce interconnect inductance for the capacitor starting at FIG. 2, an electronic device 100 in FIG. 1 is first described. As discussed below, the electronic device 100 does not include an additional power plane in a dielectric layer of an adjacent metallization layer, to reduce the thickness of the dielectric material between the first and additional power planes to reduce interconnect inductance for the capacitor.

In this regard, FIG. 1 is a side view of the electronic device 100. The electronic device 100 includes an integrated circuit (IC) package 102 coupled to a circuit board 104 as a routing substrate 106. The IC package 102 in this example includes a first die 108(1) that is coupled to a package substrate 109. For example, the first die 108(1) may include a graphics processor chip 110. The IC package 102 also includes a second die 108(2) that is stacked above the first die 108(1) in a first, vertical direction (Z-axis direction) and is coupled to the first die 108(1). For example, the second die 108(2) may include a central processing unit (CPU) chip 112. The first and second dies 108(1), 108(2) are electrically coupled to the package substrate 109 through respective external interconnects 114(1), 114(2) (e.g., solder balls, ball grid array (BGA) interconnects). The package substrate 109 includes one or more metallization layers that include metal lines that are interconnected to provide signal routing paths between the first and second dies 108(1), 108(2) and external interconnects 115 (e.g., solder balls, BGA interconnects) of the package substrate 109. The IC package 102 is coupled to the circuit board 104 through the external interconnects 115.

With continuing reference to FIG. 1, the circuit board 104 includes a plurality of metallization layers 116(1)-116(6) that each include metal lines that can provide signal routing paths within the circuit board 104. For example, the external interconnects 115 of the IC package 102 are coupled to the first metallization layer 116(1) of the circuit board 104 to electrically couple the IC package 102 and its first and second dies 108(1), 108(2) to the circuit board 104. The circuit board 104 in this example includes power planes that are configured to be coupled to a power source as part of a power distribution network such that power can be tapped from these power planes to supply power to the IC package 102 and its first and second dies 108(1), 108(2) for operation. For example, as shown in FIG. 1, the second metallization layer 116(2) in the circuit board 104 includes a second metal layer 118(2) that includes a first power plane 120(1) configured to be coupled to a ground connection for a power source. The third metallization layer 116(3) in the circuit board 104 includes a third metal layer 118(3) that includes a second power plane 120(2) configured to be coupled to a power signal connection for a power source. Also, in this example, the fourth metallization layer 116(4) in the circuit board 104 includes a fourth metal layer 118(4) that includes a third power plane 120(3) also configured to be coupled to a ground connection for a power source.

A first capacitor 122(1) and second capacitor 122(2) are also coupled to the power planes 120(1)-120(3) of the circuit board 104 in the electronic device 100 in FIG. 1. For example, the first capacitor 122(1) may provide decoupling capacitance or filter for circuits in the first die 108(1), and the second capacitor 122(2) may provide decoupling capacitance or filter for circuits in the second die 108(2). The first and second capacitors 122(1), 122(2) can provide a capacitor as part of filtering circuit for the respective first and second dies 108(1), 108(2). In this example, the first and second capacitors 122(1), 122(2) provide a decoupling capacitance to shunt noise from power and other circuits in the first and second dies 108(1), 108(2). The first capacitor 122(1) has a first terminal 124(1) that is coupled to the first power plane 120(1) and second terminals 124(2) that are coupled to the second power plane 120(2). In this example, the first capacitor 122(1) and its first and second terminals 124(1), 124(2) are electrically coupled to the circuit board 104 and the sixth metallization layer 116(6). Metal lines 126 in the sixth metal layer 118(6) of the sixth metallization layer 116(6) can route signals between the first capacitor 122(1) and the first and second power planes 120(1), 120(2). The second capacitor 122(2) has a first terminal 128(1) that is coupled to the third power plane 120(3) and second terminals 128(2) that are coupled to the second power plane 120(2). In this example, the second capacitor 122(2) and its first and second terminals 128(1), 128(2) are electrically coupled to the circuit board 104 and the sixth metallization layer 116(6). Metal lines 126 in the sixth metal layer 118(6) of the sixth metallization layer 116(6) can route signals between the second capacitor 122(2) and the second and third power planes 120(2), 120(3).

As shown in FIG. 1, the first and second power planes 120(1), 120(2) are separated a first height $H_1$ in the first, vertical direction (Z-axis direction) from each other in the first, vertical direction (Z-axis direction) by the thickness of a third dielectric layer 130(3) of the third metallization layer 116(3) in the circuit board 104. The second and third power planes 120(2), 120(3) are separated a second height $H_2$ in the first, vertical direction (Z-axis direction) from each other in the first, vertical direction (Z-axis direction) by the thickness of a fourth dielectric layer 130(4) of the fourth metallization layer 116(4) in the circuit board 104. The thickness of the third dielectric layer 130(3) of the third metallization layer 116(3) in the circuit board 104, as indicated by the first height $H_1$, between the first and second power planes 120(1), 120(2) in adjacent second and third metallization layers 116(2), 116(3) affects the interconnect inductance of the first capacitor 122(1) coupled to the first and second power planes 120(1), 120(2). This is because there is a flux loop created between the first and second power planes 120(1), 120(2) when power signals are carried in the first and second power planes 120(1), 120(2). Likewise, the thickness of the third dielectric layer 130(3) of the third metallization layer 116(3) in the circuit board 104, as indicated by the second height $H_2$, between the second and third power planes 120(2), 120(3) in adjacent third and fourth metallization layers 116(3), 116(4) affects the interconnect inductance of the second capacitor 122(2) coupled to the second and third power planes 120(2), 120(3). Again, this is because there is a flux loop created between the second and third power planes 120(2), 120(3) when power signals are carried in the second and third power planes 120(2), 120(3).

The greater the thickness of a dielectric layer between the power planes, the larger the interconnect inductance between those power planes. An increased interconnect inductance can result in a loss of performance of the first and second capacitors 122(1), 122(2) coupled to the respective first and second power planes 120(1), 120(2), and the second and third power planes 120(2), 120(3). This is less of an issue for the first capacitor 122(1), because the first capacitor 122(1) a signal routing path to the IC package 102 than the second capacitor 122(2). The first capacitor 122(1) is coupled to the circuit board 104 below the IC package 102 in a first, vertical direction (Z-axis direction), whereas the second capacitor 122(2) is coupled to the circuit board 104 laterally offset in the first, vertical direction (Z-axis direction) from the IC package 102. Thus, the signal routing paths to the second capacitor 122(2) involve routing in the second and third power planes 120(2), 120(3) that extend horizontally in a second, horizontal direction (X- and/or Y-axis directions) orthogonal to the first, vertical direction (Z-axis direction) in their respective third and fourth metal layers 118(3), 118(4), thus increasing the signal routing path length between the IC package 102 and the second capacitor 122(2). This increased signal routing path length to the second capacitor 122(2) means that the second capacitor 122(2) may have a larger interconnect inductance than the first capacitor 122(1), because increased signal routing distance can also result in an increase interconnect inductance.

The interconnect inductance for the first capacitor 122(1) may be within acceptable limits due to the reduced signal routing path length between the IC package 102 and the first capacitor 122(1). However, the interconnect inductance for the second capacitor 122(2) may be outside of acceptable limits due to the increased signal routing path length between the IC package 102 and the second capacitor 122(2). The second capacitor 122(2) could be coupled to a different location on the circuit board 104 to reduce the signal routing path length to between the IC package 102 and the second capacitor 122(2). However, this may not be possible or feasible for package area restrictions and/or other limitations. For example, in the electronic device 100 in FIG. 1, the first capacitor 122(1) occupies space underneath the IC package 102. It is desired to be able to couple a capacitor to a die in an electronic device that allows for lateral displacement that involves signal routing paths between the capacitor and the die in a horizontal direction, but with a reduced interconnect inductance.

Figure 2A:
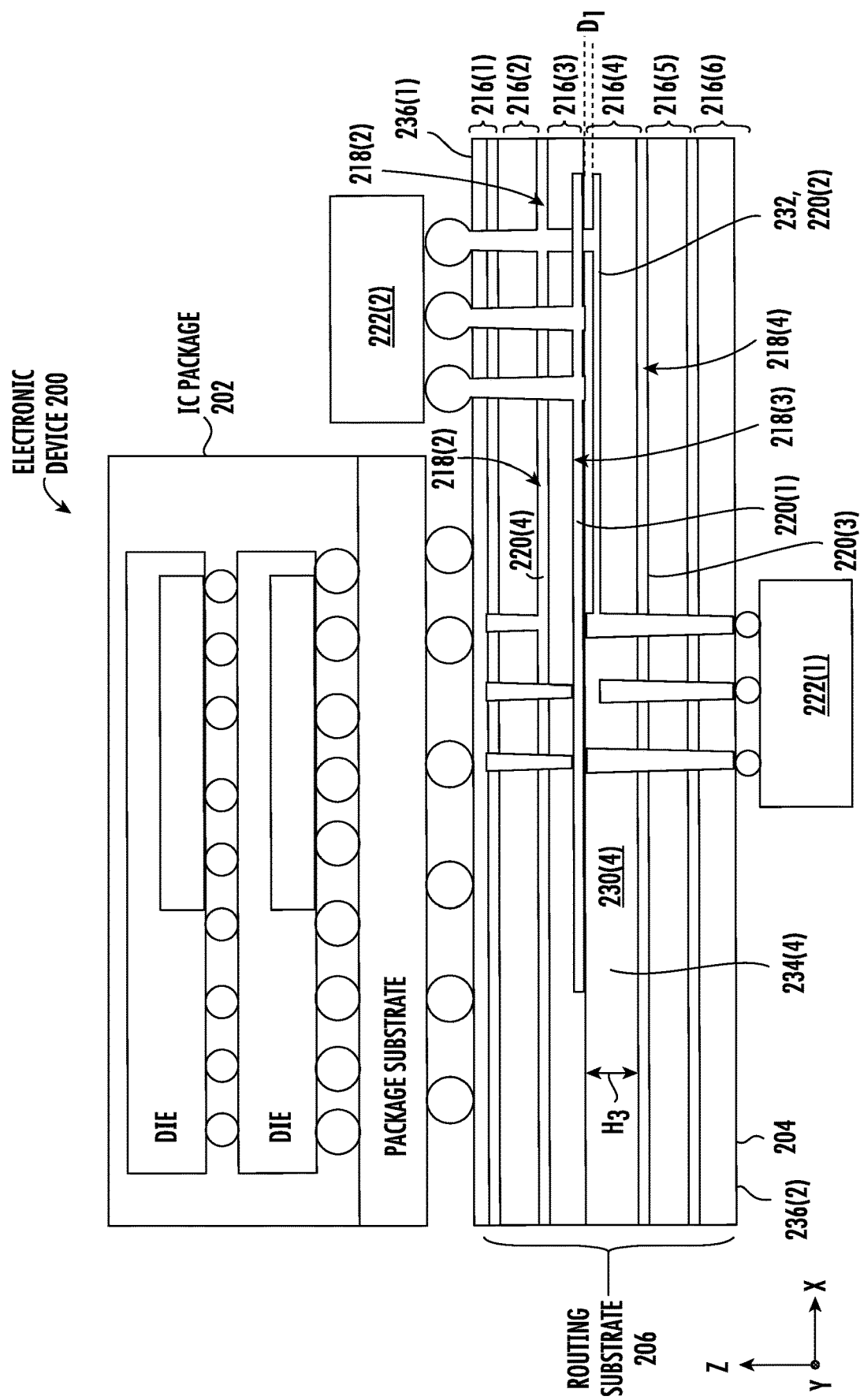
FIGS. 2A and 2B are side views of an exemplary electronic device that includes an IC package coupled to a circuit board as a routing substrate, and a capacitor coupled to a first power plane disposed in a metal layer of a first metallization layer of the circuit board, and coupled to an additional metal plane as an additional power plane disposed in a dielectric layer of an adjacent, second metallization layer, to reduce the thickness of the dielectric material between the first and additional power planes coupled to the capacitor, to reduce interconnect inductance for the capacitor.
Figure 2B:
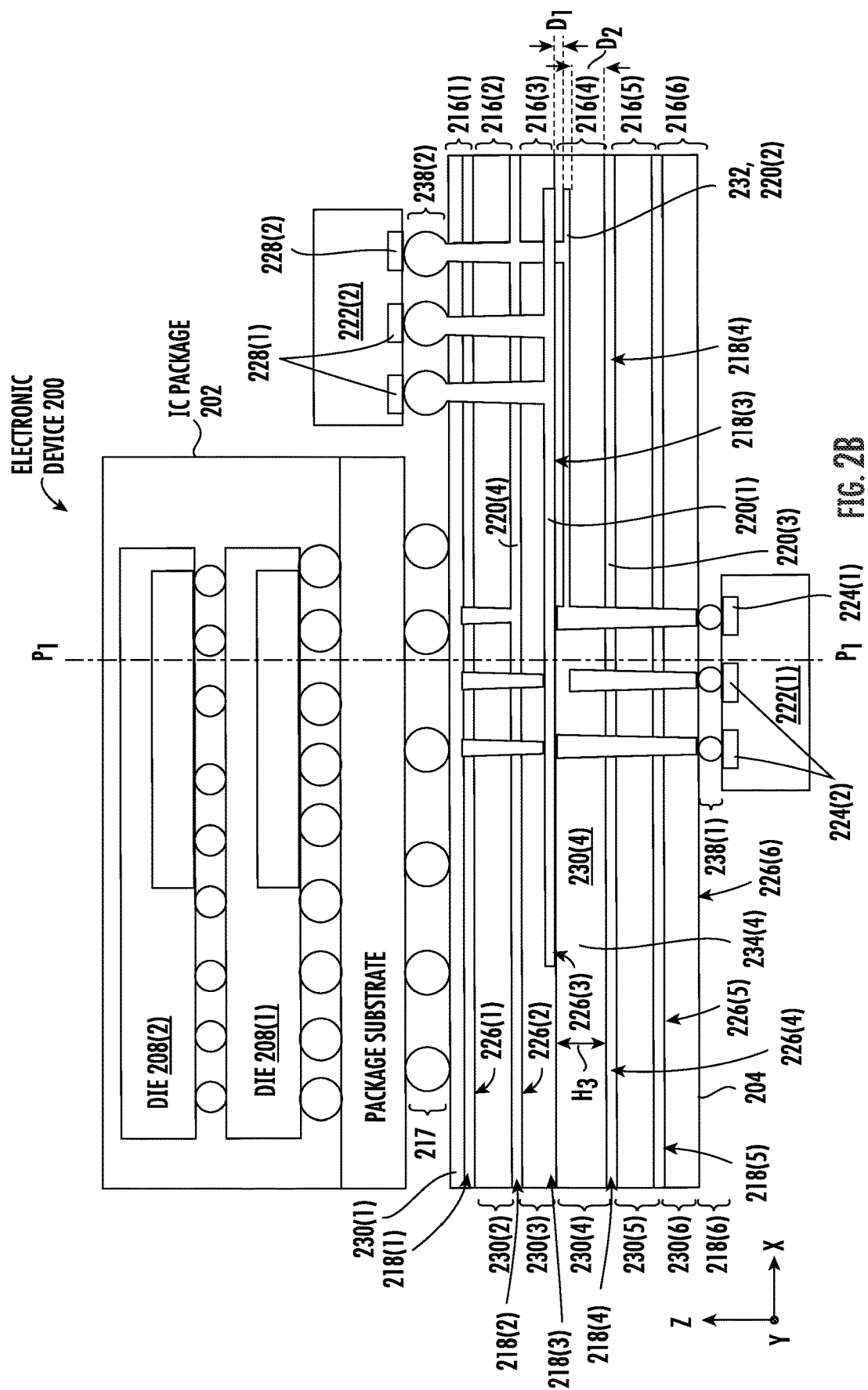

In this regard, FIGS. 2A and 2B are side views of exemplary electronic device 200 that includes an IC package 202 coupled to a circuit board 204 as a routing substrate 206 with reduced interconnect inductance between a second capacitor 222(2) and the IC package 202. In this regard, as described in more detail below and shown in FIG. 2A, the second capacitor 222(2) is coupled to a first power plane 220(1) disposed in a third metal layer 218(3) of a third metallization layer 216(3) of the circuit board 204 for a first power connection. A power plane is a metal line or plane disposed in a metallization layer. The first power plane 220(1) is configured to carry a first power signal of a power source. The second capacitor 222(2) is also coupled to an additional metal plane 232 as an additional, second metal plane 220(2), also referred to as a "second power plane 220(2)," disposed in the fourth dielectric layer 230(4) of an adjacent, fourth metallization layer 216(4), to reduce the thickness of a dielectric material 234(4) between a first power plane 220(1) and the additional, second power plane 220(2) coupled to the second capacitor 222(2). The second power plane 220(2) is disposed in the fourth dielectric layer 230(4) of the fourth metallization layer 216(4) adjacent to the third metallization layer 216(3) and between the third metal layer 218(3) and the fourth metal layer 218(4) in a first, vertical direction (Z-axis direction) orthogonal to a second, horizontal direction (X- and/or Y-axes directions) of the metallization layers 216(1)-216(6), the second, horizontal direction orthogonal to the first, vertical direction. The second power plane 220(2) is configured to carry a second power signal (or a return signal) of a power source. This has the effect of reducing interconnect inductance to the second capacitor 222(2), because a first distance $D_1$ between the first power plane 220(1) and the additional, second power plane 220(2) is reduced, as compared to the third height $H_3$ in the first, vertical direction (Z-axis direction) between the first power plane 220(1) and the third power plane 220(3) for example. In this manner, the flux loop created between the first power plane 220(1) and the additional, second power plane 220(2) when power signals are carried in the first power plane 220(1) and the additional, second power plane 220(2) are less than the flux loop between the first power plane 220(1) and the third power plane 220(3).

Providing the additional metal plane 232 in the fourth metallization layer 216(4) in this example as the additional, second power plane 220(2) reduces the thickness, indicated by a first distance $D_1$, of the dielectric material 234(4) between the additional, second power plane 220(2) and the first power plane 220(1). This may be particularly advantageous for the second capacitor 222(2) that has horizontal routing paths in the circuit board 204. Disposing the additional metal plane 232 in the fourth metallization layer 216(4) also causes the additional metal plane 232 to be located a second distance $D_2$ (FIG. 2B) from the fourth metal layer 218(4) in the fourth metallization layer 216(4) that is less than the height $H_3$ of the fourth dielectric layer 230(4). This is because fabrication of the circuit board 204 may impose or require a minimum distance (e.g., sixth (60) micrometers (μm)) between the adjacent metallization layers 216(1)-216(6) that controls a minimum dielectric layer thickness between the adjacent metallization layers 216(1)-216(6). Providing the additional, second power plane 220(2) coupled to the second capacitor 222(2) to reduce interconnect inductance to the second capacitor 222(2) may allow more flexibility in placement of the second capacitor 222(2) on the circuit board 204. For example, as shown in FIG. 2A, it may be easier to place and couple the second capacitor 222(2) on a first, top surface 236(1) of the circuit board 204 that then requires horizontal signal routing in the circuit board 204 to the second capacitor 222(2), than coupling the second capacitor 222(2) on a second, bottom surface 236(2) of the circuit board 204.

With reference to FIG. 2B, the circuit board 204 includes a plurality of metallization layers 216(1)-216(6) that each include metal layers 218(1)-218(6) that can include metal lines to provide signal routing paths within the circuit board 204. Each metallization layer 216(1)-216(6) also has a respective dielectric layer 230(1)-230(6) of a dielectric material adjacent to its respective metal layers 218(1)-218(6) to insulate the metal layers 218(1)-218(6) from each other. The metallization layers 216(1)-216(6) are parallel to each other in the second, horizontal direction (X- and/or Y-axes directions) orthogonal to the first, vertical direction (Z-axis direction). For example, the external interconnects 217 of the IC package 202 are coupled to the first metallization layer 216(1) of the circuit board 204 to electrically couple the IC package 202 and its first and second dies 208(1), 208(2) to the circuit board 204. The circuit board 204 in this example includes power planes that are configured to be coupled to a power source as part of a power distribution network such that power can be tapped from these power planes to supply power to the IC package 202 and its first and second dies 208(1), 208(2) for operation. For example, as shown in FIG. 2B, the second metallization layer 216(2) in the circuit board 204 includes the second metal layer 218(2) that includes a fourth metal plane 220(4), also referred to as a "fourth power plane 220(4)," configured to be coupled to a ground connection for a power source. The third metallization layer 216(3) in the circuit board 204 includes the third metal layer 218(3) that includes the first metal plane 220(1), also referred to as a "first power plane 220(1)," configured to be coupled to a power signal connection for a power source. The first power plane 220(1) is configured to carry a power signal of a power source. Also, in this example, the fourth metallization layer 216(4) in the circuit board 204 includes a fourth metal layer 218(4) that includes a third metal plane 220(3), also referred to as a "third power plane 220(3)," also configured to be coupled to a ground connection for a power source.

Also, as shown in FIG. 2B, a first capacitor 222(1) and second capacitor 222(2) are also coupled to the first and second power planes 220(1), 220(2) of the circuit board 204. For example, the first capacitor 222(1) may provide decoupling capacitance or filter for circuits in the first die 208(1), and the second capacitor 222(2) may provide decoupling capacitance or filter for circuits in the second die 208(2). The first and second capacitors 222(1), 222(2) can each provide a capacitor as part of filtering circuit for the respective first and second dies 208(1), 208(2). In this example, the first and second capacitors 222(1), 222(2) provide a decoupling capacitance to shunt noise from power and other circuits in the first and second dies 208(1), 208(2). The first capacitor 222(1) has a first terminal 224(1) that is coupled to the fourth power plane 220(4) and second terminals 224(2) that are coupled to the first power plane 220(1). In this example, the second capacitor 222(2) is coupled to the same first power plane 220(1) that the first capacitor 222(1) is coupled, but such is not required. For example, the second capacitor 222(2) could be coupled to a separate power plane in the same third metal layer 218(3) of the third metallization layer 216(3) that is coupled to the first power plane 220(1).

In this example, the first capacitor 222(1) and its first and second terminals 224(1), 224(2) are electrically coupled to the circuit board 204 and the sixth metallization layer 216(6) through first external interconnects 238(1) (e.g., solder balls, BGA interconnects). Metal lines 226(3)-226(6) in the third, fourth, fifth, and sixth metal layers 218(3)-218(6) of the third, fourth, fifth, and sixth metallization layers 216(3)-216(6) can route signals between the first capacitor 222(1) and the first and fourth power planes 220(1), 220(4). The second capacitor 222(2) has a first terminal 228(1) that is coupled to the third power plane 220(3) and second terminals 228(2) that are coupled to the first power plane 220(1). In this example, the second capacitor 222(2) and its first and second terminals 228(1), 228(2) are electrically coupled to the circuit board 204 and the first metallization layer 216(1) through second external interconnects 238(2) (e.g., solder balls, BGA interconnects). Metal lines 226(1)-226(3) in the first, second and third metal layers 218(1)-218(3) of the first, second, and third metallization layers 216(1)-216(3) can route signals between the second capacitor 222(2) and the first and second power planes 220(1), 220(2).

The first interconnect inductance for the first capacitor 222(1) may be within acceptable limits due to the reduced signal routing path length between the IC package 202 and the first capacitor 222(1). The first capacitor 222(1) is coupled to the circuit board 204 below the IC package 202 in the first, vertical direction (Z-axis direction) such that the IC package 202 and the first capacitor 222(1) share a common vertical plane (e.g., plane $P_1$) in the vertical direction (Y- and Z-axes directions). Thus, no horizontal signal routing paths are required in this example between the first capacitor 222(1) and the IC package 202 in the circuit board 204. However, the second capacitor 222(2) is coupled to the circuit board 204 laterally offset in the first, vertical direction (Z-axis direction) from the IC package 202 such that the second capacitor 222(2) and the IC package 202 do not share a common vertical plane in the first, vertical direction (Y- and Z-axes directions). Thus, the signal routing paths to the second capacitor 222(2) involves horizontal routing in the first and second power planes 220(1), 220(2) that extend horizontally in the second, horizontal direction (X- and/or Y-axis directions) in their respective metal layers 218(3), 218(4), thus increasing the signal routing path length between the IC package 202 and the second capacitor 222(2). This increased signal routing path length to the second capacitor 222(2) means that the second capacitor 222(2) may have a larger interconnect inductance than the first capacitor 222(1), because increased signal routing distance can also result in an increase interconnect inductance.

With the providing of the additional metal plane 232 to provide the second power plane 220(2) with a reduced distance $D_1$ to the adjacent third metal layer 218(3) and its first power plane 220(1), the second interconnect inductance for the second capacitor 222(2) is also reduced. For example, the second interconnect inductance for the second capacitor 222(2) may be reduced to sixteen (16.0) picoHenries (pH) or less (e.g., 15.1 pH or 2.5 pH). This reduced interconnect inductance can mitigate or offset an increased inductance due to an increased signal routing path length between the IC package 202 and the second capacitor 222(2). The second interconnect inductance for the second capacitor 222(2) is less than a third interconnect inductance between the first and third power planes 220(1), 220(3). The third interconnect inductance between the first and third power planes 220(1), 220(3) may be over 170 pH (e.g., 176 pH). This is because of the increased height $H_3$ of the fourth dielectric layer 230(4) and its dielectric material 234(4) between the first and third power planes 220(1), 220(3), as compared to the reduced first distance $D_1$ between the first and second power planes 220(1), 220(2) coupled to the second capacitor 222(2). This can, for example, allow the second capacitor 222(2) to be coupled to the circuit board 204 laterally offset from the IC package 202 in the first, vertical direction (Z-axis direction) and the second interconnect inductance of the second capacitor 222(2) still be within acceptable or desired limits.

As another example, the third height $H_3$ of the fourth dielectric layer 230(4) may be between fifty (50) μm and seventy (70) μm. The first distance $D_1$ between the additional metal plane 232 in the fourth dielectric layer 230(4) that provides the second power plane 220(2) and the third metal layer 218(3) in the adjacent, third metallization layer 216(3) may be between 1.0 μm and 5.0 μm. A ratio of the third height $H_3$ of the fourth dielectric layer 230(4) to the first distance $D_1$ between the additional metal plane 232 in the fourth dielectric layer 230(4) and the third metal layer 218(3) in the third metallization layer 216(3) can be at least 10.0. As another example, a ratio of the third interconnect inductance between the first and third power planes 220(1), 220(3) to the second interconnect inductance between the first and second power planes 220(1), 220(2) may be at least 10.0. Note that the providing of the first capacitor 222(1) or any other capacitors in the electronic device 200 is not required.

Figure 3A:
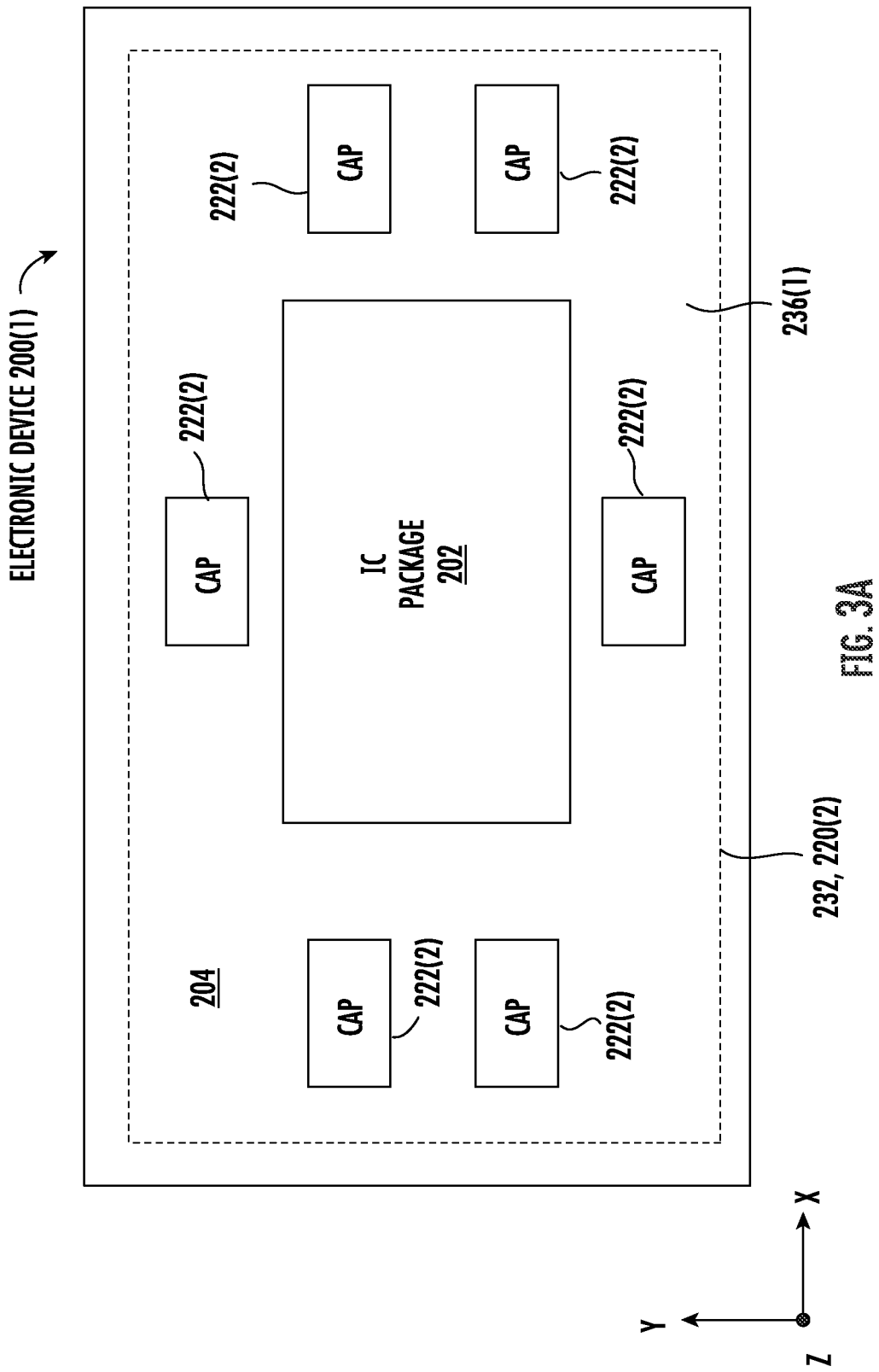
Figure 3C:
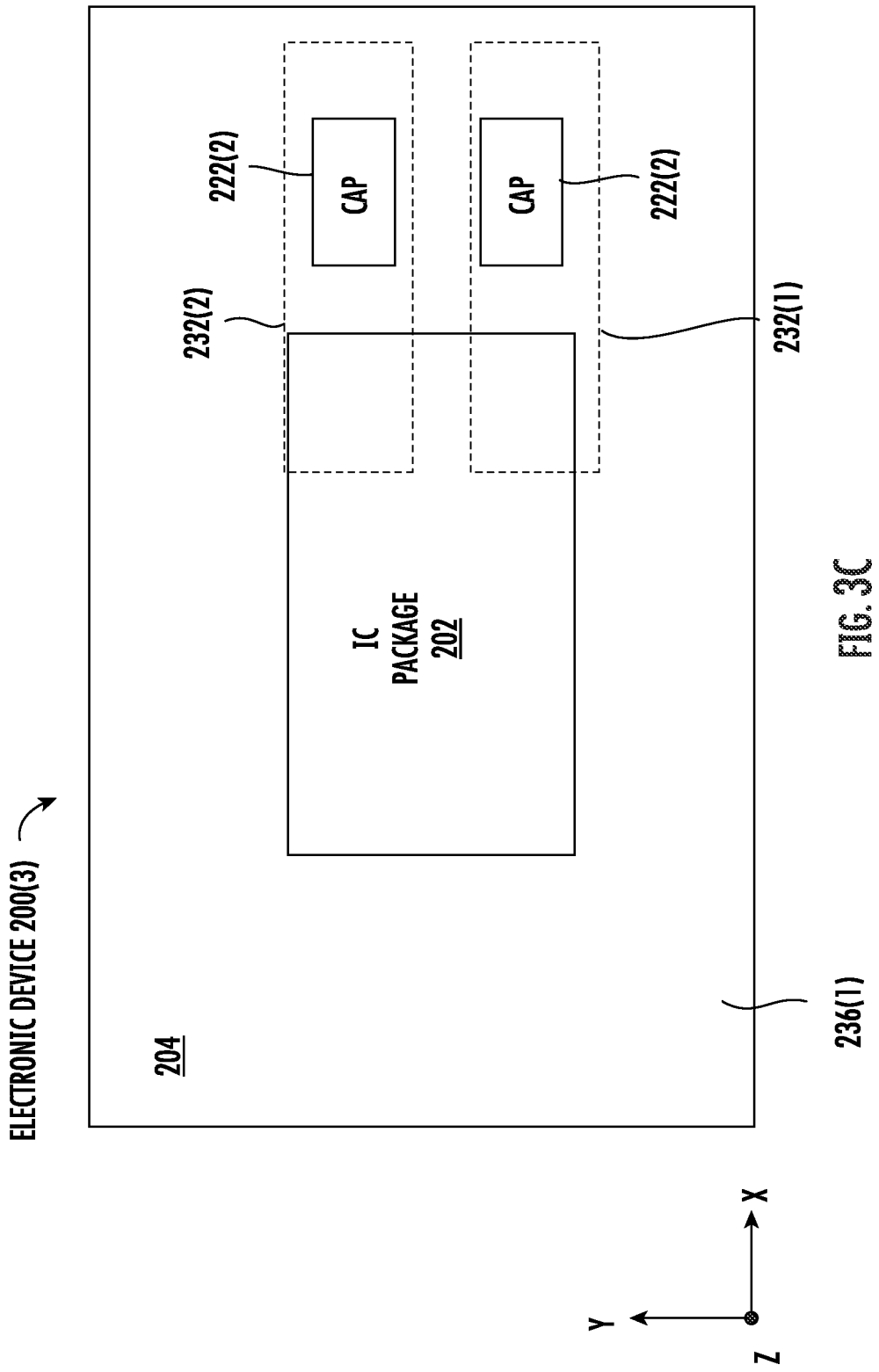

FIGS. 3A-3C are top views of exemplary layouts of the electronic device 200 in FIGS. 2A and 2B, illustrating an additional metal plane 232 provided by the disposed in a dielectric layer of a metallization layer of the circuit board 204 to provide an additional power plane for the second capacitor 222(2) to reduce interconnect inductance. As shown in FIG. 3A, an electronic device 200(1) is provided that is similar to the electronic device 200 in FIGS. 2A and 2B. In the electronic device 200(1) in FIG. 3A, a plurality of second capacitors 222(2) are placed on the first, top surface 236(1) of the circuit board 204. The second capacitors 222(2) are placed on the circuit board 204 laterally displaced from the IC package 202 in the second, horizontal direction (X- and/or Y-axes directions). In this example in FIG. 3A, because there are a number of second capacitors 222(2) disposed around the IC package 202, the additional metal plane 232 is provided in a larger horizontal area in the second horizontal direction (X- and/or Y-axes directions) such that the second capacitor 222(2) can be coupled to the additional metal plane through a signal routing path in the first, vertical direction (Z-axis direction).

As shown in FIG. 3B, another electronic device 200(2) is provided that is similar to the electronic device 200 in FIGS. 2A and 2B. In the electronic device 200(2) in FIG. 3B, a plurality of second capacitors 222(2) are placed on the first, top surface 236(1) of the circuit board 204. The second capacitors 222(2) are placed on the circuit board 204 laterally displaced from the IC package 202 in the second, horizontal direction (X- and/or Y-axes directions). In this example in FIG. 3B, because there are less second capacitors 222(2) disposed around the IC package 202 than in the electronic device 200(1) in FIG. 3A, the additional metal plane 232 can be provided in a reduced horizontal area (in the X- and Y-axes directions) such that the second capacitors 222(2) can be coupled to the additional metal plane through a signal routing path in the first, vertical direction (Z-axis direction).

As shown in FIG. 3C, another electronic device 200(3) is provided that is similar to the electronic device 200 in FIGS. 2A and 2B. In the electronic device 200(3) in FIG. 3C, two (2) second capacitors 222(2) are placed on the first, top surface 236(1) of the circuit board 204. The second capacitors 222(2) are placed on the circuit board 204 laterally displaced from the IC package 202 in the second, horizontal direction (X- and/or Y-axes directions). In this example in FIG. 3C, two (2) separate additional metal planes 232(1), 232(2) are provided in the circuit board 204 that are coupled to the respective second capacitors 222(2). The additional metal planes 232(1), 232(2) can be provided in a reduced horizontal area in the second, horizontal directions (in the X- and Y-axes directions) such that the second capacitors 222(2) can be coupled to the additional metal plane through a signal routing path in the first, vertical direction (Z-axis direction). In this example, the two (2) capacitors 222(2) can be coupled to their different respective power planes in different power domains. Thus, using this example, the two (2) separate additional metal planes 232(1), 232(2) are disposed between different respective power planes in each power domain coupled to the respective capacitors 222(2).

Figure 4:
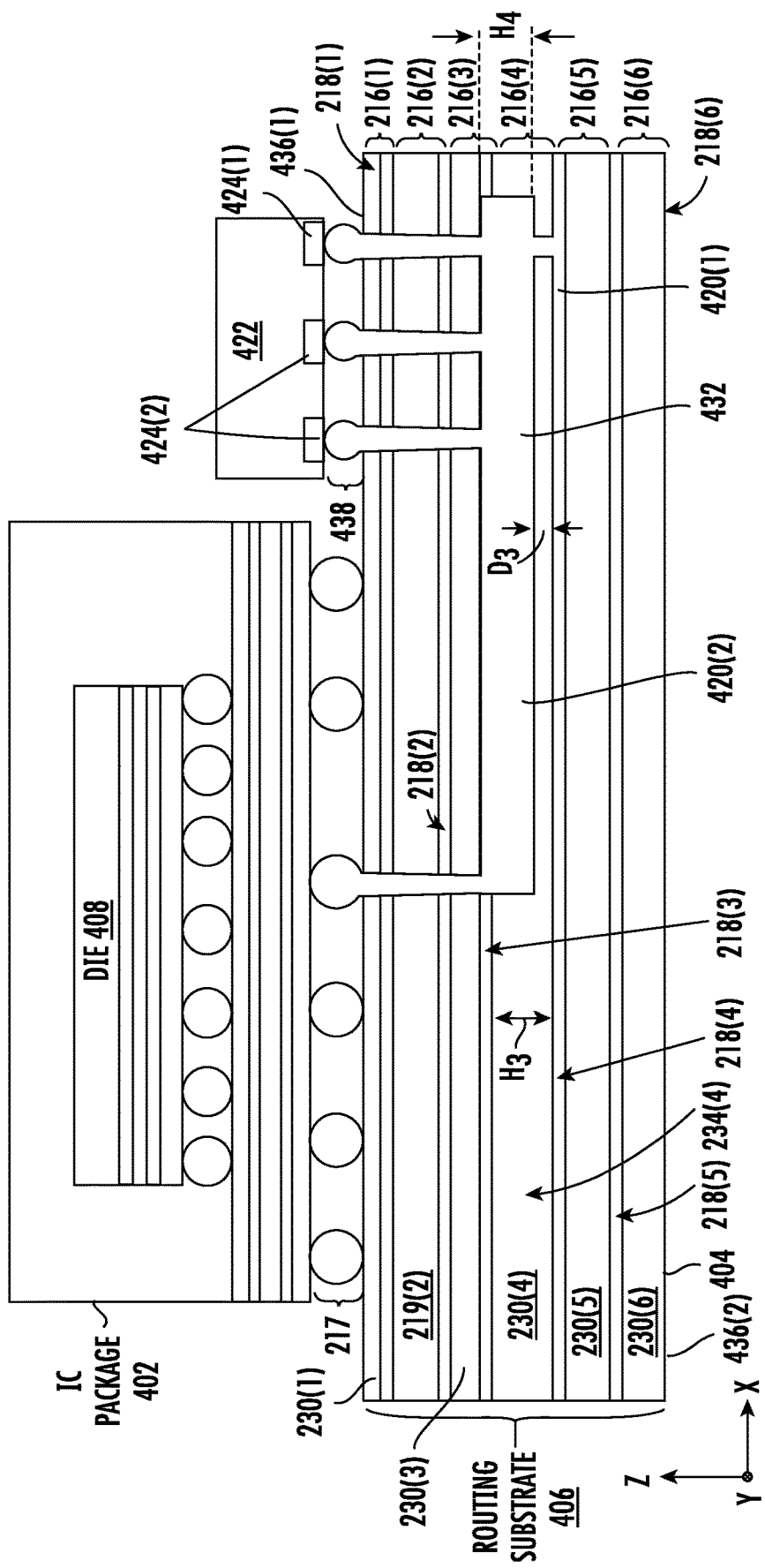
FIG. 4 is a side view of another exemplary electronic device that includes an IC package coupled to a circuit board as a routing substrate, and a capacitor coupled to a first power plane disposed in a first metal layer of a first metallization layer of the circuit board, and coupled to an additional metal plane as an additional power plane disposed in a second metal layer of an adjacent, second metallization layer and partially in the dielectric layer between the adjacent first and second metal layers, to reduce the thickness of the dielectric material between the first and additional power planes coupled to the capacitor, to reduce interconnect inductance for the capacitor.

FIG. 4 is a side view of another exemplary electronic device 400 that includes an IC package 402 coupled to a circuit board 404 as a routing substrate 406 with reduced interconnect inductance between a capacitor 422 and the IC package 402. The electronic device 400 is similar to the electronic device 200 in FIGS. 2A-2B. Common elements between the electronic device 200 in FIGS. 2A and 2B and the electronic device 400 in FIG. 4 are shown with common element numbers.

However, as discussed in more detail below, a thicker additional metal plane 432, with an increased fourth height $H_4$ in the first, vertical direction (Z-axis direction) over the height of the additional metal plane 232 in FIGS. 2A-2B, is disposed in the fourth dielectric layer 230(4) of the fourth metallization layer 216(4) is provided in the electronic device 400 in FIG. 4. The additional metal plane 432 provides an, additional, second metal plane 420(2), also referred to as a "second power plane 420(2)," in the circuit board 404. The second power plane 420(2) in this example is disposed in the third metal layer 218(3) of the third dielectric layer 216(3) and also partially disposed in the fourth dielectric layer 230(4) of the fourth metallization layer 216(4), as opposed to being provided as a separate metal plane that is not at least partially disposed in the third metal layer 218(3). The second power plane 420(2) is configured to carry a second power signal (or a return signal) of a power source. A capacitor 422 is coupled to the first metal plane 420(1), also referred to as a "first power plane 420(1)," disposed in a fourth metal layer 218(4) of the fourth metallization layer 216(4) of the circuit board 204 for a first power connection. The capacitor 422 is also coupled to the additional metal plane 432 as the second power plane 420(2) disposed in the fourth dielectric layer 230(4) of an adjacent, fourth metallization layer 216(4), to reduce the thickness of a dielectric material 234(4) between the first power plane 420(1) and the additional, second power plane 420(2) coupled to the capacitor 422. The second power plane 420(2) is disposed in the fourth dielectric layer 230(4) of the fourth metallization layer 216(4) adjacent to the third metallization layer 216(3) and between the third metal layer 218(3) and the fourth metal layer 218(4) in the first, vertical direction (Z-axis direction) orthogonal to the second, horizontal direction (X- and/or Y-axes directions) of the metallization layers 216(1)-216(6), orthogonal to the first, vertical direction (Z-axis direction).

The additional metal plane 432 as the second power plane 420(2) has the effect of reducing interconnect inductance to the capacitor 422. This is because a third distance $D_3$ between the first power plane 420(1) and the additional, second power plane 420(2) is reduced, as compared to the third height $H_3$ in the first, vertical direction (Z-axis direction) between the third metal layer 218(3) in the third metallization layer 216(3) and the first power plane 420(1)

in the fourth metal layer 218(4) in the adjacent fourth metallization layer 216(4) for example. In this manner, the flux loop created between the first power plane 420(1) and the additional, second power plane 420(2) when power signals are carried in the first power plane 420(1) and the additional, second power plane 420(2) is less than the flux loop between the third metal layer 218(3) and the first power plane 420(1).

Providing the additional metal plane 432 in the fourth metallization layer 216(4) as the additional, second power plane 420(2) reduces the thickness (third distance $D_3$) of the dielectric material 234(4) between the additional, second power plane 420(2) and the first power plane 420(1). This may be particularly advantageous for the capacitor 422 that has horizontal routing paths in the circuit board 404. This is because fabrication of the circuit board 404 may impose or require a minimum distance (e.g., sixty (60) micrometers (μm)) between adjacent metallization layers 216(1)-216(6) that control a minimum dielectric layer thickness between adjacent metallization layers 216(1)-216(6). Providing of the additional metal plane 432 coupled to the capacitor 422 to reduce interconnect inductance to the capacitor 422 may allow more flexibility in placement of the capacitor 422 on the circuit board 404. For example, as shown in FIG. 4, it may be easier to place and couple the capacitor 422 on the first, top surface 436(1) of the circuit board 404 that then requires horizontal signal routing in the circuit board 404 to the capacitor 422, than coupling capacitor 422 on the second, bottom surface 436(1) of the circuit board 404.

With continued reference to FIG. 4, in this example, external interconnects 217 of the IC package 402 are coupled to the first metallization layer 216(1) of the circuit board 404 to electrically couple the IC package 402 and its die 408 to the circuit board 404. The circuit board 404 in this example includes power planes that are configured to be coupled to a power source as part of a power distribution network such that power can be tapped from these power planes to supply power to the IC package 402 and its die 408 for operation. For example, as shown in FIG. 4, the fourth metallization layer 216(4) in the circuit board 404 includes the fourth metal layer 218(4) that includes the first power plane 420(1) configured to be coupled to a ground signal connection for a power source. The first power plane 420(1) is configured to carry a power signal of a power source. Also, in this example, the fourth metallization layer 216(4) in the circuit board 404 includes the additional, second power plane 420(2) also configured to be coupled to a power signal connection for a power source.

Also, as shown in FIG. 4, the capacitor 422 may provide decoupling of capacitance or a filter for circuits in the die 408. The capacitor 422 can provide a capacitor as part of filtering circuit for the die 408. In this example, the capacitor 422 provides a decoupling capacitance to shunt noise from power and other circuits in the die 408. The capacitor 422 has a first terminal 424(1) that is coupled to the first power plane 420(1) and second terminals 424(2) that are coupled to the second power plane 420(2). The first and second terminals 424(1), 424(2) are electrically coupled to the circuit board 404 and the first metallization layer 216(1) through external interconnects 438 (e.g., solder balls, BGA interconnects). Metal lines in the third, fourth, fifth, and sixth metal layers 218(3)-218(6) of the third, fourth, fifth, and sixth metallization layers 216(3)-216(6) can route signals between the capacitor 422 and the first and second power planes 420(1), 420(2).

The capacitor 422 is coupled to the circuit board 404 laterally offset in a first, vertical direction (Z-axis direction) from the IC package 402 such that the capacitor 422 and the IC package 402 do not share a common vertical plane in the first, vertical direction (Y- and Z-axes directions). Thus, the signal routing paths to the capacitor 422 involves horizontal routing in the first and second power planes 420(1), 420(2) that extend horizontal in a second, horizontal direction (X- and/or Y-axis directions) orthogonal to the first, vertical direction (Z-axis direction) in their respective third and fourth metallization layers 216(3), 216(4) thus increasing the signal routing path length between the IC package 402 and the capacitor 422. This increased signal routing path length to the capacitor 422 means that the capacitor 422 may have a larger interconnect inductance than the first capacitor 122(1), because increased signal routing distance can also result in an increase interconnect inductance. However, with the providing of the additional metal plane 432 to provide the second power plane 420(2) with a reduced third distance $D_3$ to the adjacent fourth metal layer 218(4) and its first power plane 420(1), the interconnect inductance for the capacitor 422 is reduced. For example, the interconnect inductance for the capacitor 422 may be reduced to sixteen (16.0) picoHenries (pH) or less (e.g., 15.1 pH or 2.5 pH). This reduced interconnect inductance can mitigate or offset an increased inductance due to an increased signal routing path length between the IC package 402 and the capacitor 422. The interconnect inductance for the capacitor 422 is less than an interconnect inductance between the third metal layer 218(3) and the first power plane 420(1). The interconnect inductance between the third metal layer 218(3) and the first power plane 420(1) may be over 170 pH (e.g., 176 pH). This is because of the increased height $H_3$ of the fourth dielectric layer 230(4) and its dielectric material 234(4) between the third metal layer 218(3) and the first power plane 420(1) as compared to the reduced third distance $D_3$ between the first and second power planes 420(1), 420(2) coupled to the capacitor 422. This can, for example, allow the capacitor 422 to be coupled to the circuit board 204 laterally offset from the IC package 402 in the first, vertical direction (Z-axis direction) and the second interconnect inductance of the second capacitor 222(2) still be within acceptable or desired limits.

As another example, the third height $H_3$ of the fourth dielectric layer 230(4) may be between fifty (50) μm and seventy (70) μm. The third distance $D_3$ between the additional metal plane 432 in the fourth dielectric layer 230(4) that provides the second power plane 420(2), and the adjacent, fourth metal layer 418(4) may be between 1.0 μm and 5.0 μm. A ratio of the third height $H_3$ of the fourth dielectric layer 230(4) to the third distance $D_3$ between the additional metal plane 432 in the fourth dielectric layer 230(4) and the fourth metal layer 218(4) in the fourth metallization layer 216(4) can be at least 10.0. As another example, a ratio of the interconnect inductance between the third metal layer 218(3) and the first power plane 420(1) to the interconnect inductance between the first and second power planes 420(1), 420(2) may be at least ten (10.0). Note that additional capacitors could be could to the circuit board 404 in FIG. 4 and its power planes 420(1)-420(3).

Note that while the routing substrate 406 in the electronic device 400 in FIG. 4 has an increased thickness additional, second metal plane 420(2) that is also part of the third metal layer 218(3) in the third metallization layer 216(3), such is not required. For example, the increased thickness additional, second metal plane 420(2) could be fully disposed outside of the third metal layer 218(3) and fully disposed within the fourth dielectric layer 230(4) of the fourth metallization layer 216(4), similar to the second metal plane 220(2) in the electronic device 200 in FIGS. 2A and 2B. But, with the increased thickness additional, second metal plane 420(2) being disposed within the fourth dielectric layer 230(4) of the fourth metallization layer 216(4), the second metal plane 420(2) could be provided to reduce the distance between the second metal plane 420(2) and both the adjacent third and fourth metal layers 218(3), 218(4). Thus, a power plane connection between the capacitor 422 to the second metal plane 420(2) and metal plane in either of the adjacent third and fourth metal layers 218(3), 218(4) could still provide a reduced interconnect inductance.

Figure 5:
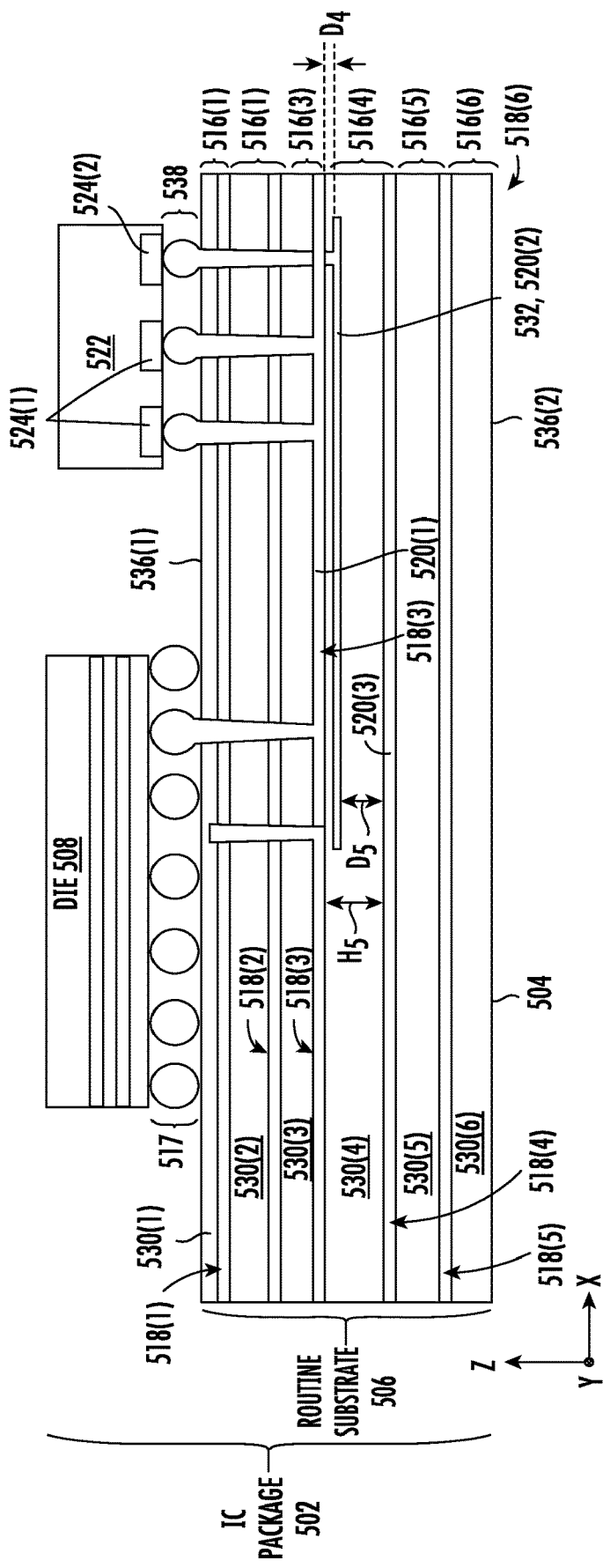
FIG. 5 is a side view of another exemplary electronic device that includes an IC package as a routing substrate, and a capacitor coupled to a first power plane disposed in an metal layer of a first metallization layer of the circuit board, and coupled to an additional metal plane as an additional power plane disposed in a dielectric layer of an adjacent, second metallization layer, to reduce the thickness of the dielectric material between the first and additional power planes coupled to the capacitor, to reduce interconnect inductance for the capacitor.

FIG. 5 is a side view of another exemplary electronic device 500 that includes an IC package 502 that has a package substrate 504 as a routing substrate 506 with reduced interconnect inductance between a capacitor 522 and a die 508. As described in more detail below and shown in FIG. 5, the capacitor 522 is coupled to a first metal plane 520(1), also referred to as a "first power plane 520(1)," disposed in a third metal layer 518(3) of a third metallization layer 516(3) of the package substrate 504 for a first power connection. The first power plane 520(1) is configured to carry a first power signal of a power source. The capacitor 522 is also coupled to an additional metal plane 532 as an additional, second metal plane 520(2), also referred to as a "second power plane 520(2)," disposed in the fourth dielectric layer 530(4) of an adjacent, fourth metallization layer 516(4), to reduce the thickness of a dielectric material 534(4) between the first power plane 520(1) and the additional, second power plane 520(2) coupled to the capacitor 522. The second power plane 520(2) is disposed in the fourth dielectric layer 530(4) of the fourth metallization layer 516(4) adjacent to the third metallization layer 516(3) and between the third metal layer 518(3) and the fourth metal layer 518(4) in a first, vertical direction (Z-axis direction) orthogonal to a second, horizontal direction (X- and/or Y-axes directions) of the metallization layers 516(1)-516(6) orthogonal to the first, vertical direction (Z-axis direction). The second power plane 520(2) is configured to carry a second power signal (or a return signal) of a power source. This has the effect of reducing interconnect inductance to the capacitor 522, because a fourth distance $D_4$ between the first power plane 520(1) and the additional, second power plane 520(2) is reduced, as compared to the fifth height $H_5$ in the first, vertical direction (Z-axis direction) between the first power plane 520(1) and the second power plane 520(2) for example. In this manner, the flux loop created between the first power plane 520(1) and the additional, second power plane 520(2) when power signals are carried in the first power plane 520(1) and the additional, second power plane 520(2) is less than the flux loop between the first power plane 520(1) and the third metal plane 520(3), also referred to as a "third power plane 520(3)," in the adjacent fourth metal layer 518(4) of the fourth metallization layer 516(4).

Providing the additional metal plane 532 in the fourth metallization layer 516(4) in this example as the additional, second power plane 520(2) reduces the thickness, indicated by fourth distance $D_4$, of the dielectric material 534(4) between the second power plane 520(2) and the first power plane 520(1). This may be particularly advantageous for the capacitor 522 that has horizontal routing paths in the package substrate 504. Disposing the additional metal plane 532 in the fourth metallization layer 516(4) also causes the additional metal plane 532 to be located a fifth distance $D_5$ from the fourth metal layer 518(4) in the fourth metallization layer 516(4) that is less than the fifth height $H_5$ of the fourth dielectric layer 530(4). This is because fabrication of the package substrate 504 may impose or require a minimum distance (between adjacent metallization layers 516(1)-516(6) that control a minimum dielectric layer thickness between adjacent metallization layers 516(1)-516(6)). Providing of the additional, second power plane 520(2) coupled to the capacitor 522 to reduce interconnect inductance to the capacitor 522 may allow more flexibility in placement of the capacitor 522 on the package substrate 504. For example, as shown in FIG. 5, it may be easier to place and couple the capacitor 522 on the first, top surface 536(1) of the package substrate 504 that then requires horizontal signal routing in the package substrate 504 to the capacitor 522, than coupling the capacitor 522 on the second, bottom surface 536(1) of the package substrate 504.

With reference to FIG. 5, the package substrate 504 includes a plurality of metallization layers 516(1)-516(6) that each include metal layers 518(1)-518(6) that can include metal lines to provide signal routing paths within the package substrate 504. Each metallization layer 516(1)-516(6) also has a respective dielectric layer 530(1)-530(6) of a dielectric material adjacent to its respective metal layers 518(1)-518(6) to insulate the metal layers 518(1)-518(6) from each other. The metallization layers 516(1)-516(6) are parallel to each other in a first, horizontal direction (X- and/or Y-axes directions). For example, external interconnects 517 are coupled between the die 508 and the first metallization layer 516(1) of the package substrate 504 to electrically couple the die 508 to the package substrate 504. The package substrate 504 in this example includes power planes that are configured to be coupled to a power source as part of a power distribution network such that power can be tapped from these power planes to supply power to the package substrate 504 and the die 508(1) for operation. For example, as shown in FIG. 5, the third metallization layer 516(3) in the package substrate 504 includes a third metal layer 518(3) that includes the first power plane 520(1) configured to be coupled to a ground connection for a power source. The fourth metallization layer 516(4) in the package substrate 504 includes the second power plane 520(2) provided by the additional metal plane 532 and configured to be coupled to a power signal connection for a power source. Also, in this example, the fourth metallization layer 516(4) in the circuit board 204 includes a fourth metal layer 518(4) that includes a third power plane 520(3) also configured to be coupled to a ground connection for a power source.

Also, as shown in FIG. 5, the die 508 is also coupled to the first and second power planes 520(1), 520(2) in the package substrate 504. The capacitor 522 may provide decoupling capacitance or filter for circuits in the die 508. The capacitor 522 can provide a capacitor as part of filtering circuit for the dies 508. In this example, the capacitor 522 provides a decoupling capacitance to shunt noise from power and other circuits in the die 508. The capacitor 522 has a first terminal 524(1) that is coupled to the first power plane 520(1) and a second terminal 524(2) that is coupled to the additional, second power plane 520(2). In this example, the capacitor 522 may be a deep trench capacitor (DTC) as an example. The capacitor 522 and its first and second terminals 524(1), 524(2) are electrically coupled to the package substrate 504 and the first metallization layer 516(1) through external interconnects 538 (e.g., solder balls, BGA interconnects). Metal lines in the first, second, third, and fourth metal layers 518(1)-518(4) of the first, second, third, and fourth metallization layers 516(1)-516(4) can route signals between the capacitor 522 and the first and second power planes 520(1), 520(2).

With continuing reference to FIG. 5, the capacitor 522 is coupled to the package substrate 504, laterally offset in the first, vertical direction (Z-axis direction) from the die 508 such that the capacitor 522 and the die 508 do not share a common vertical plane in the first, vertical direction (Y- and Z-axes directions). Thus, the signal routing path to the capacitor 522 involves horizontal routing in the first and second power planes 520(1), 520(2) that extend horizontally in a second, horizontal direction (X- and/or Y-axis directions) in their respective third and fourth metal layers 518(3), 518(4), thus increasing the signal routing path length between the die 508 and the capacitor 522. This increased signal routing path length to the capacitor 522 means that the capacitor 522 may have a larger interconnect inductance, because increased signal routing distance can also result in an increase interconnect inductance.

With the providing of the additional metal plane 532 to provide the second power plane 520(2) with a reduced fourth distance $D_4$ to the adjacent third metal layer 518(3) and its first power plane 520(1), the interconnect inductance for the capacitor 522 is also reduced. For example, the interconnect inductance for the capacitor 522 may be reduced to sixteen (16.0) picoHenries (pH) or less (e.g., 15.1 pH or 2.5 pH). This reduced interconnect inductance can mitigate or offset an increased inductance due to an increased signal routing path length between the die 508 and the capacitor 522. The interconnect inductance for the capacitor 522 is less than an interconnect inductance between the second and third power planes 520(2), 520(3). The interconnect inductance between the second and third power planes 520(2), 520(3) may be over 170 pH (e.g., 176 pH). This is because of the increased fifth height $H_5$ of the fourth dielectric layer 530(4) and its dielectric material 534(4) between the second and third power planes 520(2), 520(3) as compared to the reduced fourth distance $D_4$ between the first and second power planes 520(1), 520(2) coupled to the capacitor 522. This can for example, allow the capacitor 522 to be coupled to the package substrate 504 laterally offset from the die 508 in the first, vertical direction (Z-axis direction) and the interconnect inductance of the capacitor 522 still be within acceptable or desired limits.

As another example, the fifth height $H_5$ of the fourth dielectric layer 530(4) may be between fifty (50) μm and seventy (70) μm. The fourth distance $D_4$ between the additional metal plane 532 in the fourth dielectric layer 530(4) that provides the second power plane 520(2) and the third metal layer 518(3) in the adjacent, third metallization layer 516(3) may be between 1.0 μm and 5.0 μm. A ratio of the fifth height $H_5$ of the fourth dielectric layer 530(4) to the fourth distance $D_4$ between the additional metal plane 532 in the fourth dielectric layer 530(4) and the third metal layer 518(3) in the third metallization layer 516(3) can be at least 10.0. As another example, a ratio of the interconnect inductance between the second and third power planes 520(2), 520(3) to the interconnect inductance between the first and second power planes 520(2), 520(4) may be at least ten (10.0).

Figure 6:
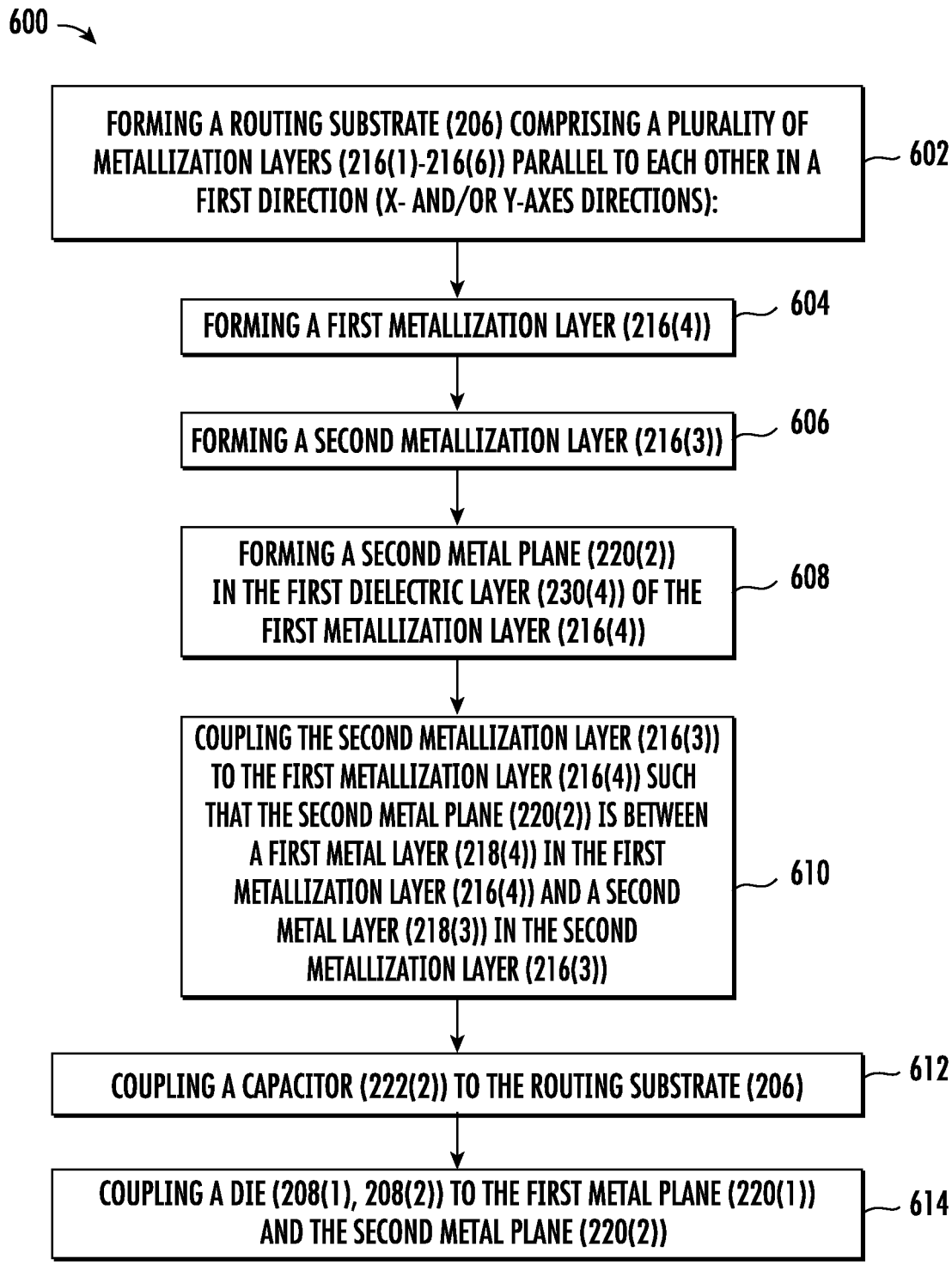
FIG. 6 is a flowchart illustrating an exemplary fabrication process of fabricating a routing substrate for an electronic device, wherein the routing substrate includes a metal layer as a first power plane in a first metallization layer of the circuit board, and an additional metal plane as a second, additional power plane disposed in a dielectric layer of an adjacent, second metallization layer, to reduce the thickness of the dielectric material between the first and additional power planes, to reduce interconnect inductance, including but not limited to the routing substrates in FIGS. 2A-5.

Fabrication processes can be employed to fabricate an electronic device and its routing substrate, wherein the routing substrate includes a metal layer as a first power plane in a first metallization layer of the circuit board, and an additional metal plane as an additional power plane disposed in a dielectric layer of an adjacent, second metallization layer, to reduce the thickness of the dielectric material between the first and additional power planes, to reduce interconnect inductance, including but not limited to the electronic devices 200, 200(1)-200(3), 400, 500 and routing substrates 206, 406, 506 in FIGS. 2A-5. In this regard, FIG. 6 is a flowchart illustrating an exemplary fabrication process 600 of fabricating an electronic device that includes a routing substrate, wherein the routing substrate includes a metal layer as a first power plane in a first metallization layer of the circuit board, and an additional metal plane as an additional power plane disposed in a dielectric layer of an adjacent, second metallization layer, to reduce the thickness of the dielectric material between the first and additional power planes, to reduce interconnect inductance, including but not limited to the electronic devices 200, 200(1)-200(3), 400, 500 and routing substrates 206, 406, 506 in FIGS. 2A-5. The fabrication process 600 in FIG. 6 is discussed with regard to the electronic device 200 and routing substrate 206 in FIGS. 2A and 2B, but note that the fabrication process 700 is not limited to fabricating an electronic device 200 and routing substrate 206 in FIGS. 2A and 2B.

In this regard, as shown in FIG. 6, a first step in the fabrication process 600 to fabricate the electronic device 200 in this example can include forming a routing substrate 206 comprising a plurality of metallization layers 216(1)-216(6) parallel to each other in a first direction (X- and/or Y-axes directions) (block 602 in FIG. 6). A next step in the forming the routing substrate 206 in the fabrication process 600 can include forming a first metallization layer as the fourth metallization layer 216(4) (block 604 in FIG. 6). Forming the fourth metallization layer 216(4) can include forming a first metal layer as the fourth metal layer 218(4) comprising a third metal plane 220(3) and forming a first dielectric layer as the fourth dielectric layer 230(4) adjacent to the fourth metal layer 218(4). A next step in the forming the routing substrate 206 in the fabrication process 600 can include forming a second metallization layer as the third metallization layer 216(3) (block 606 in FIG. 6). Forming the third metallization layer 216(3) can include forming a second metal layer as the third metal layer 218(3) and forming a second dielectric layer as the third dielectric layer 230(3) adjacent to the third metal layer 218(3). The first metal plane 220(1) can be formed in the third metallization layer 216(3). A next step in the forming the routing substrate 206 in the fabrication process 600 can include forming a second metal plane 220(2) in the fourth dielectric layer 230(4) of the fourth metallization layer 216(4) (block 608 in FIG. 6). A next step in the forming the routing substrate 206 in the fabrication process 600 can include coupling the third metallization layer 216(3) to the fourth metallization layer 216(4) such that the second metal plane 220(2) is between the fourth metal layer 218(4) in the fourth metallization layer 216(4) and the third metal layer 218(3) in the third metallization layer 216(3) (block 610 in FIG. 6). A next step in the fabrication process 600 to fabricate the electronic device 200 can include coupling a second capacitor 222(2) to the routing substrate 206 (block 612 in FIG. 6). Coupling the second capacitor 222(2) can include the step of coupling the second capacitor 222(2) to one of the first metal plane 220(3) and the first metal plane 220(1), and coupling the second capacitor 222(2) to the second metal plane 220(2). A next step in the fabrication process 600 to fabricate the electronic device 200 can include coupling a first and second die 208(1), 208(2) to the first metal plane 220(3) and the second metal plane 220(4) (block 614 in FIG. 6).

Other fabrication processes can also be employed to fabricate an electronic device and its routing substrate, wherein the routing substrate includes a metal layer as a first power plane in a first metallization layer of the circuit board, and an additional metal plane as an additional, second power plane disposed in a dielectric layer of an adjacent, second metallization layer, to reduce the thickness of the dielectric material between the first and additional power planes, to reduce interconnect inductance, including but not limited to the electronic devices 200, 200(1)-200(3), 400, 500 and routing substrates 206, 406, 506 in FIGS. 2A-5.

In this regard, FIGS. 7A-7C is a flowchart illustrating another exemplary fabrication process 700 of a routing substrate for an electronic device, wherein the routing substrate includes a metal layer as a first power plane in a first metallization layer of the circuit board, and an additional metal plane as an additional, second power plane disposed in a dielectric layer of an adjacent, second metallization layer, to reduce the thickness of the dielectric material between the first and additional, second power planes, to reduce interconnect inductance, including but not limited to the electronic devices 200, 200(1)-200(3), 400, 500 and routing substrates 206, 406, 506 in FIGS. 2A-5. FIGS. 8A-8F are exemplary fabrication stages 800A-800F during fabrication of the routing substrate according to the fabrication process 700 in FIGS. 7A-7C. In the fabrication process 700 in FIGS. 7A-7C, the additional metal plane with a reduced distance to an adjacent metallization layer is formed in an upper portion of a dielectric layer to be closer in distance to an adjacent metal layer above the additional metal plane in the vertical direction (Z-axis direction).

In this regard, as shown in the fabrication stage 800A in FIG. 8A, a first step in the fabrication process 700 is to form a core substrate 802 and first and second metal layers 804(1), 804(2) (e.g., copper layers) on respective outer surfaces 806(1), 806(2) of the core substrate 802 (block 702 in FIG. 7A). In this example, the routing substrate to be formed includes the core substrate 802 as an inner layer. Also, as shown in fabrication stage 800A in FIG. 8A, openings 808(1), 808(2) are formed in the respective metal layers 804(1), 804(2) to form separate metal planes 810(1)-810(6). The first and second metal layers 804(1), 804(2) will serve as metal layers for addition metallization layers to be formed. The metal planes 810(1), 810(4) are coupled to each other through a first metal via 812(1) formed in the core substrate 802. The metal planes 810(3), 810(6) are coupled to each other through a second metal via 812(2) formed in the core substrate 802.

Then, as shown in the fabrication stage 800B in FIG. 8B, a next step in the fabrication process 700 is to form first and second dielectric layers 814(1), 814(2) of dielectric material over the respective first and second metal layers 804(1), 804(2) to insulate the respective metal planes 810(1)-810(6) formed on the outer surfaces 806(1), 806(2) of the core substrate 802 (block 704 in FIG. 7A). For example, the first and second dielectric layers 814(1), 814(2) may be laminated onto the metal layers 804(1), 804(2). Then, as also shown in the fabrication stage 800B in FIG. 8B, third and fourth metal layers 804(3), 804(4) (e.g., copper layers) are then formed on the outer surfaces 816(1), 816(2) of the first and second dielectric layers 814(1), 814(2) (block 704 in FIG. 7A).

Then, as shown in the fabrication stage 800C in FIG. 8C, a next step in the fabrication process 700 is to pattern and remove portions of the fourth metal layer 804(4) to form an additional metal plane 810(7) as a ground plane in this example (block 706 in FIG. 7A). In this example, the metal plane 810(7) is an additional metal plane that will be disposed in a subsequently formed dielectric layer to provide a power plane with a reduced distance to an adjacent metal plane to be formed on the dielectric layer to reduce interconnect inductance to the additional metal plane 810(7). In this regard, as shown in the fabrication stage 800D in FIG. 8D, a next step is to form a third dielectric layer 814(3) on the additional metal plane 810(7) and the second dielectric layer 814(2), and a fifth metal layer 804(5) on the third dielectric layer 814(3) (block 708 in FIG. 7B). As shown in FIG. 8D, the distance $D_6$ between the fifth metal layer 804(5) and the metal plane 810(5) is less than the height $H_6$ of the second and third dielectric layers 814(2), 814(3) between the second and fifth metal layers 804(2), 804(5). Thus, if a component, such as a capacitor is coupled to the additional metal plane 810(7) and a metal plane formed in the fifth metal layer 804(5) as power planes, the interconnect inductance as a result of such connection will be less than if the component were coupled to a metal plane formed in the fifth metal layer 804(5) and a metal plane 810(4)-810(6) in the second metal layer 804(2) as power planes.

Then, as shown in the fabrication stage 800E in FIG. 8E, a next step in the fabrication process 700 is to pattern the third and fifth metal layers 804(3), 804(5) to form metal vias 812(3)-812(4) and metal vias 812(5)-812(6) coupled to respective metal planes 810(1), 810(3) and metal planes 810(4), 810(6) (block 710 in FIG. 7B). As also shown in the fabrication stage 800E in FIG. 8E, the respective third and fourth metal layers 804(3), 804(4) are patterned and metal lines or metal planes 810(8)-810(13) are formed in the third and fourth metal layers 804(3), 804(4). The metal planes 810(8), 810(10) are formed in contact with metal vias 812(3), 812(4). The metal planes 810(11), 810(13) are formed in contact with metal vias 812(5), 812(6). Then, as shown in the fabrication stage 800F in FIG. 8F, a next step in the fabrication process 700 is to form additional dielectric layers 814(4), 814(5) on the respective third and fourth metal layers 804(3), 804(4) to insulate the metal planes 810(8)-810(13) (block 712 in FIG. 7C). Also as shown in the fabrication stage 800F in FIG. 8F, the additional dielectric layers 814(4), 814(5) are patterned and openings formed therein to form metal vias 812(7), 812(8) coupled to the respective metal planes 810(9), 810(11) (block 712 in FIG. 7C). Additional metal layers 804(6), 804(7) are then formed on the additional dielectric layers 814(4), 814(5) and patterned to form additional metal planes 810(14)-810(19) in the respective metal layers 804(6), 804(7) (block 712 in FIG. 7C). Metal planes 810(15), 810(18) are coupled to the respective metal vias 812(7), 812(8) to couple the metal planes 810(15), 810(18) to respective metal planes 810(7), 810(12).

FIGS. 9A-9C is a flowchart illustrating another exemplary fabrication process 900 of a routing substrate for an electronic device, wherein the routing substrate includes a metal layer as a first power plane in a first metallization layer of the circuit board, and an additional metal plane as an additional, second power plane disposed in a dielectric layer of an adjacent, second metallization layer, to reduce the thickness of the dielectric material between the first and second power planes, to reduce interconnect inductance, including but not limited to the electronic devices 200, 200(1)-200(3), 400, 500 and routing substrates 206, 406, 506 in FIGS. 2A-5. FIGS. 10A-10F are exemplary fabrication stages 1000A-1000F during fabrication of the routing substrate according to the fabrication process 900 in FIGS. 9A-9C. In the fabrication process 900 in FIGS. 9A-9C, the additional metal plane with a reduced distance to an adjacent metallization layer is formed in a lower portion of a dielectric layer to be closer in distance to an adjacent metal layer below the additional metal plane in the vertical direction (Z-axis direction).

In this regard, as shown in the fabrication stage 1000A in FIG. 10A, a first step in the fabrication process 900 is to form a core substrate 1002 and first and second metal layers 1004(1), 1004(2) (e.g., copper layers) on respective outer surfaces 1006(1), 1006(2) of the core substrate 1002 (block 902 in FIG. 9A). In this example, the routing substrate to be formed includes the core substrate 1002 as an inner layer. Also, as shown in fabrication stage 1000A in FIG. 10A, openings 1008(1), 1008(2) are formed in the respective first and second metal layers 1004(1), 1004(2) to form separate metal planes 1010(1)-1010(6). The first and second metal layers 1004(1), 1004(2) will serve as metal layers for addition metallization layers to be formed. The metal planes 1010(1), 1010(4) are coupled to each other through a first metal via 1012(1) formed in the core substrate 1002. The metal planes 1010(3), 1010(6) are coupled to each other through a second metal via 1012(2) formed in the core substrate 1002.

Then, as shown in the fabrication stage 1000B in FIG. 10B, a next step in the fabrication process 900 is to form a thin resin on the second metal layer 1004(2) as a first dielectric layer 1014(1) and a third metal layer 1004(3) on the first dielectric layer 1014(1) (block 904 in FIG. 9A). The first dielectric layer 1014(1) is to provide an additional metal plane formed in the third metal layer 1004(3) that has a reduced distance to the second metal layer 1004(2) so that a component coupled to the additional metal plane formed in the third metal layer 1004(3) has a reduced interconnect inductance. In this regard, as shown in the fabrication stage 1000C in FIG. 10C, a next step in the fabrication process 900 is to pattern and remove portions of the third metal layer 1004(3) to form an additional metal plane 1010(7) as a ground plane in this example (block 906 in FIG. 9A). In this example, the metal plane 1010(7) is an additional metal plane that will be disposed in a subsequently formed dielectric layer to provide a power plane with a reduced distance to an adjacent metal plane to be formed on the dielectric layer to reduce interconnect inductance to the additional metal plane 1010(7).

Then, as shown in the fabrication stage 1000D in FIG. 10D, a next step in the fabrication process 900 is to form a second and third dielectric layers 1014(2), 1014(3) on the respective first metal layer 1004(1) and first dielectric layer 1014(1) and then to form additional fourth and fifth metal layers 1004(4), 1004(5) on the respective second and third dielectric layers 1014(2), 1014(3) (block 908 in FIG. 9B). The second and third dielectric layers 1014(2), 1014(3) insulate the first and second metal layers 1004(1), 1004(2) from the fourth and fifth metal layers 1004(4), 1004(5). As shown in FIG. 10D, the distance $D_7$ between the second metal layer 1004(2) and the additional metal plane 1010(7) is less than the height $H_7$ of the third dielectric layer 1014(3) between the second and fifth metal layers 1004(2), 1004(5). Thus, if a component such as a capacitor is coupled to the additional metal plane 1010(7) and a metal plane formed in the second metal layer 1004(4) as power planes, the interconnect inductance as a result of such connection will be less than if the component were coupled to a metal plane formed in the second metal layer 1004(2) and a metal plane in the fifth metal layer 1004(5) as power planes.

Then, as shown in the fabrication stage 1000E in FIG. 10E, a next step in the fabrication process 900 is to pattern the fourth and fifth metal layers 1004(4), 1004(5) to form metal vias 1012(3)-1012(4) coupled to respective metal planes 1010(1), 1010(3) and metal vias 1012(5)-1012(6) coupled to metal planes 1010(4), 1010(6) (block 910 in FIG. 9B). As also shown in the fabrication stage 1000E in FIG. 10E, the respective fourth and fifth metal layers 1004(4), 1004(5) are patterned and metal lines or metal planes 1010(8)-1010(13). The metal planes 1010(8), 1010(10) are formed in contact with metal vias 1012(3), 1012(4). The metal planes 1010(11), 1010(13) are formed in contact with metal vias 1012(5), 1012(6). Then, as shown in the fabrication stage 1000F in FIG. 10F, a next step in the fabrication process 900 is to form additional dielectric layers 1014(4), 1014(5) on the respective fourth and fifth metal layers 1004(4), 1004(5) to insulate the metal planes 1010(8)-1010(13) (block 912 in FIG. 9C). Also as shown in the fabrication stage 1000F in FIG. 10F, the additional dielectric layer 1014(4) is patterned and openings formed therein to form metal vias 1012(7), 1012(8) coupled to the respective metal planes 1010(8), 1010(9) in this example (block 912 in FIG. 9C). Additional metal layers 1004(6), 1004(7) are then formed on the respective additional dielectric layers 1014(4), 1014(5) and patterned to form additional metal planes 810(14)-812(19) in the respective metal layers 1004(6), 1004(7) (block 912 in FIG. 9C). Metal planes 1010(14), 1010(15) are coupled to the respective metal vias 1012(7), 1012(8) to couple the metal planes 1010(14), 1010(15) to respective metal planes 1010(8), 1010(9).

Note that the term "metal plane" relates to a metal structure that can be is disposed in a plane in two or more axes of direction. The term "power plane" is a metal plane that is configured to be coupled to a power source to conduct a power signal. The terms "top" and "bottom" are relative terms and not necessarily limited to a component described as a "top" or "bottom" component being above or below another component with respect to the earth/ground. Also note that a component described as "disposed in," such as disposed in a layer, a package substrate, or a circuit board herein is not limited to such component being fully disposed in such layer, a package substrate, or a circuit board. Also note that the term "external" used with reference to a particular component or structure, including without limitation a package substrate, a circuit board, die, and capacitor, is a component that that is fully or partially exposed from an outer surface of such component or structure.

Electronic devices that include a routing substrate that includes a metal layer as a first power plane in a first metallization layer of the circuit board, and an additional metal plane as an additional, second power plane disposed in a dielectric layer of an adjacent, second metallization layer, to reduce the thickness of the dielectric material between the first and second power planes, to reduce interconnect inductance, including but not limited to the electronic devices 200, 200(1)-200(3), 400, 500 and routing substrates 206, 406, 506 in FIGS. 2A-5, 8A-8F, and 10A-10F, and according to, but not limited to, any of the exemplary fabrication processes in FIGS. 6-8C, and 9A-9C, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, laptop computer, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 11:
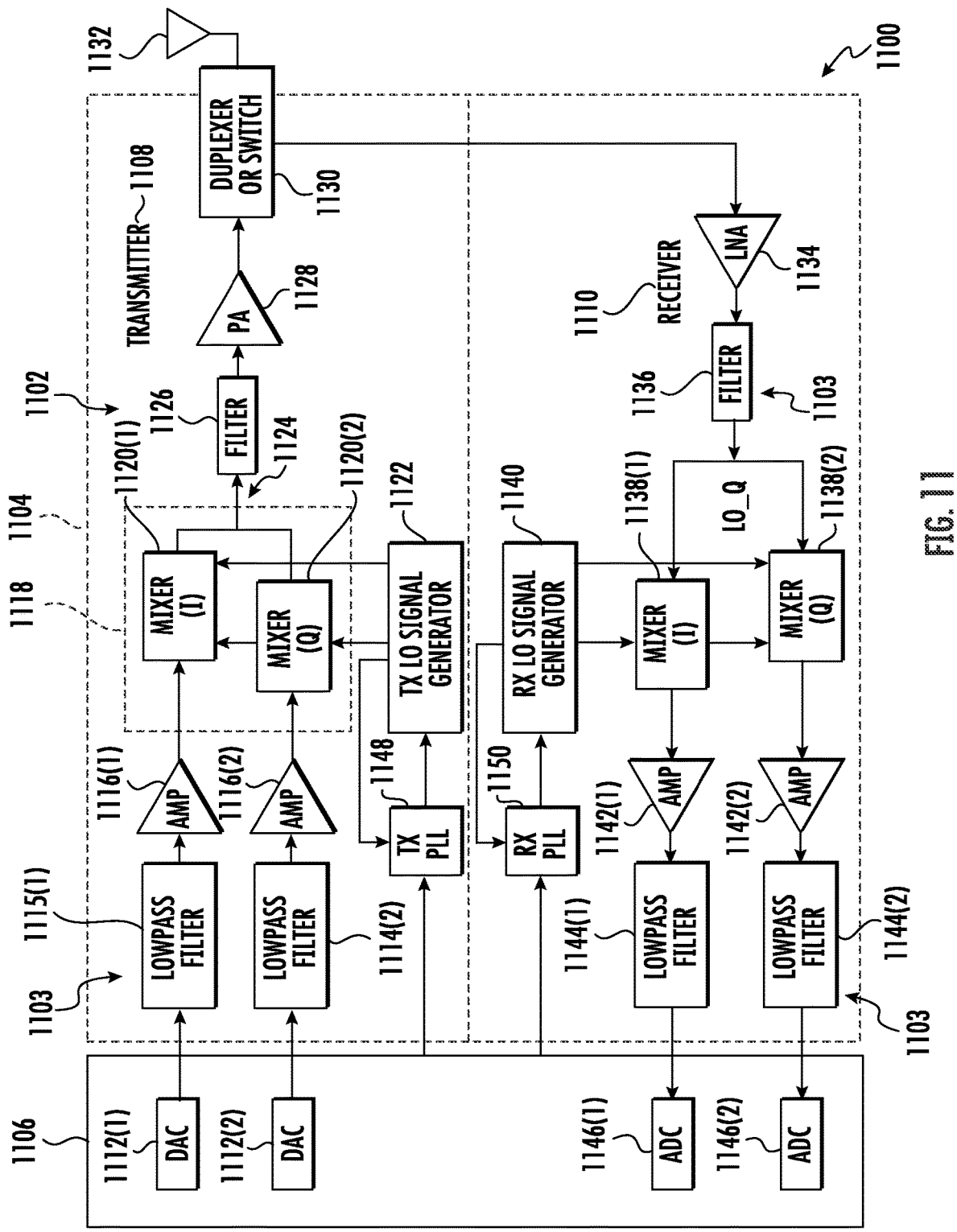
FIG. 11 is a block diagram of an exemplary wireless communication device that includes radio-frequency (RF) components that can include an electronic device that includes a routing substrate, and a capacitor coupled to a first power plane disposed in an metal layer of a first metallization layer of the circuit board, and coupled to an additional metal plane as a second, additional power plane disposed in a dielectric layer of an adjacent, second metallization layer, to reduce the thickness of the dielectric material between the first and second power planes coupled to the capacitor, to reduce interconnect inductance for the capacitor, including but not limited to the electronic devices and routing substrates in FIGS. 2A-5, 8A-8F, and 10A-10F, and according to, but not limited to, any of the exemplary fabrication processes in FIGS. 6-8C, and 9A-9C, and according to, but not limited to, any of the exemplary fabrication processes in FIGS. 6-8C, and, and FIG. 12 is a block diagram of an exemplary processor-based system that can include components that can include an electronic device that includes a routing substrate, and a capacitor coupled to a first power plane disposed in an metal layer of a first metallization layer of the circuit board, and coupled to an additional metal plane as a second, additional power plane disposed in a dielectric layer of an adjacent, second metallization layer, to reduce the thickness of the dielectric material between the first and second power planes coupled to the capacitor, to reduce interconnect inductance for the capacitor, including but not limited to the electronic devices and routing substrates in FIGS. 2A-5, 8A-8F, and 10A-10F, and according to, but not limited to, any of the exemplary fabrication processes in FIGS. 6-8C, and 9A-9C.

FIG. 11 illustrates an exemplary wireless communications device 1100 that includes radio-frequency (RF) components formed from one or more ICs 1102, wherein any of the ICs 1102 can be included in an electronic device 1103. The electronic device 1103 can include routing substrate that includes a metal layer as a first power plane in a first metallization layer of the circuit board, and an additional metal plane as an additional, second power plane disposed in a dielectric layer of an adjacent, second metallization layer, to reduce the thickness of the dielectric material between the first and second power planes, to reduce interconnect inductance, including but not limited to the electronic devices 200, 200(1)-200(3), 400, 500 and routing substrates 206, 406, 506 in FIGS. 2A-5, 8A-8F, and 10A-10F, and according to, but not limited to, any of the exemplary fabrication processes in FIGS. 6-8C, and 9A-9C, and according to any aspects disclosed herein. The wireless communications device 1100 may include or be provided in any of the above-referenced devices, as examples. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RF ICs (RFICs), mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, for example, from RF to an intermediate frequency (IF) in one stage, and then from IF to baseband in another stage for the receiver 1110. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1111(1), 1112(2) for converting digital signals generated by the data processor 1106 into the I and Q analog output signals (e.g., I and Q output currents) for further processing.

Within the transmitter 1108, lowpass filters 1114(1), 1214(2) filter the I and Q analog output signals, respectively, to remove undesired signals caused by the prior digital-to-analog conversion. Amplifiers (AMPs) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals through mixers 1120(1), 1120(2) from a TX LO signal generator 1122 to provide an upconverted signal 1124. A filter 1126 filters the upconverted signal 1124 to remove undesired signals caused by the frequency up-conversion as well as noise in a receive frequency band. A power amplifier (PA) 1128 amplifies the upconverted signal 1124 from the filter 1126 to obtain the desired output power level and provides a transmit RF signal. The transmit RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Downconversion mixers 1138(1), 1138(2) mix the output of the filter 1136 with I and Q RX LO signals (i.e., LO_I and LO_Q) from an RX LO signal generator 1140 to generate I and Q baseband signals. The I and Q baseband signals are amplified by AMPs 1142(1), 1142(2) and further filtered by lowpass filters 1144(1), 1144(2) to obtain I and Q analog input signals, which are provided to the data processor 1106. In this example, the data processor 1106 includes analog-to-digital converters (ADCs) 1146(1), 1146(2) for converting the analog input signals into digital signals to be further processed by the data processor 1106.

In the wireless communications device 1100 of FIG. 11, the TX LO signal generator 1122 generates the I and Q TX LO signals used for frequency up-conversion, while the RX LO signal generator 1140 generates the I and Q RX LO signals used for frequency down-conversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Figure 12:
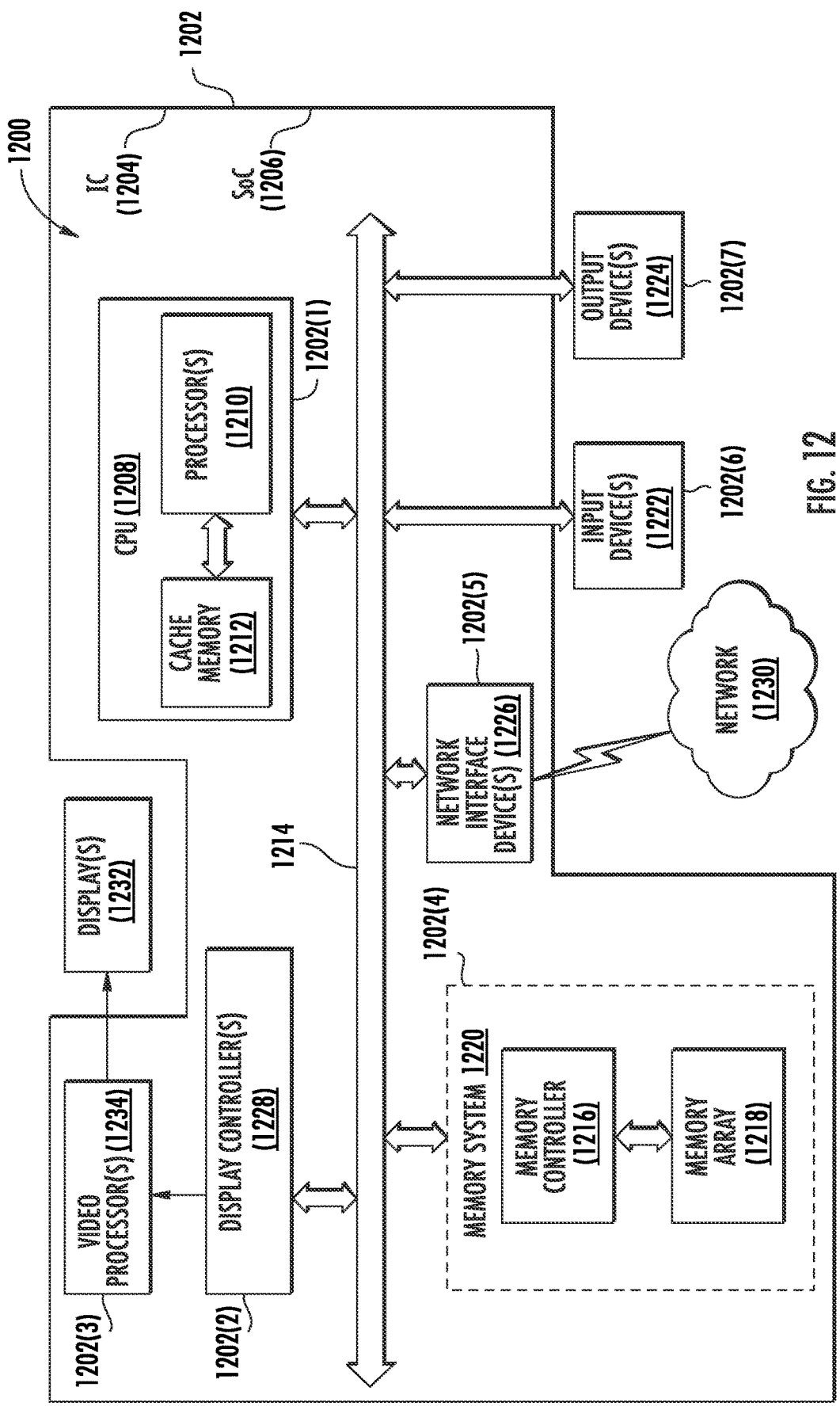

In this regard, FIG. 12 illustrates an example of a processor-based system 1200 including a circuit that can be provided in one or more electronic devices 1202(1)-1202(7). The electronic devices 1202(1)-1202(7) can include routing substrate that includes a metal layer as a first power plane in a first metallization layer of the circuit board, and an additional metal plane as an additional, second power plane disposed in a dielectric layer of an adjacent, second metallization layer, to reduce the thickness of the dielectric material between the first and second power planes, to reduce interconnect inductance, including but not limited to the electronic devices 200, 200(1)-200(3), 400, 500 and routing substrates 206, 406, 506 in FIGS. 2A-5, 8A-8F, and 10A-10F, and according to, but not limited to, any of the exemplary fabrication processes in FIGS. 6-8C, and 9A-9C, and according to any aspects disclosed herein. In this example, the processor-based system 1200 may be formed as an IC 1204 in an electronic device 1202 and as a system-on-a-chip (SoC) 1206. The processor-based system 1200 includes a central processing unit (CPU) 1208 that includes one or more processors 1210, which may also be referred to as CPU cores or processor cores. The CPU 1208 may have cache memory 1212 coupled to the CPU 1208 for rapid access to temporarily stored data. The CPU 1208 is coupled to a system bus 1214 and can intercouple master and slave devices included in the processor-based system 1200. As is well known, the CPU 1208 communicates with these other devices by exchanging address, control, and data information over the system bus 1214. For example, the CPU 1208 can communicate bus transaction requests to a memory controller 1216, as an example of a slave device. Although not illustrated in FIG. 12, multiple system buses 1214 could be provided, wherein each system bus 1214 constitutes a different fabric.

Other master and slave devices can be connected to the system bus 1214. As illustrated in FIG. 12, these devices can include a memory system 1220 that includes the memory controller 1216 and a memory array(s) 1218, one or more input devices 1222, one or more output devices 1224, one or more network interface devices 1226, and one or more display controllers 1228, as examples. Each of the memory system(s) 1220, the one or more input devices 1222, the one or more output devices 1224, the one or more network interface devices 1226, and the one or more display controllers 1228 can be provided in the same or different electronic devices 1202(2)-1202(7). The input device(s) 1222 can include any type of input device, including, but not limited to, input keys, switches, voice processors, etc. The output device(s) 1224 can include any type of output device, including, but not limited to, audio, video, other visual indicators, etc. The network interface device(s) 1226 can be any device configured to allow exchange of data to and from a network 1230. The network 1230 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1226 can be configured to support any type of communications protocol desired.

The CPU 1208 may also be configured to access the display controller(s) 1228 over the system bus 1214 to control information sent to one or more displays 1232. The display controller(s) 1228 sends information to the display(s) 1232 to be displayed via one or more video processor(s) 1234, which process the information to be displayed into a format suitable for the display(s) 1232. The display controller(s) 1228 and video processor(s) 1234 can be included as ICs in the same or different electronic devices 1202(2), 1202(3), and in the same or different electronic devices 1202 containing the CPU 1208, as an example. The display(s) 1232 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An electronic device, comprising:
    a routing substrate comprising a plurality of metallization layers parallel to each other in a first direction, the plurality of metallization layers comprising:
        a first metallization layer, comprising:
            a first metal layer comprising a first metal plane; and
            a first dielectric layer adjacent to the first metal layer;

a second metallization layer adjacent to the first metallization layer, the second metallization layer comprising:
a second metal layer; and
a second dielectric layer adjacent to the second metal layer; and
a second metal plane disposed in the first dielectric layer in the first direction between the first metal layer and the second metal layer; and
a capacitor coupled to the first metal plane and the second metal plane.

2. The electronic device of clause 1, wherein:
the first metal plane and the second metal layer are configured to create a first interconnect inductance in response to a voltage differential between the first metal plane and the second metal layer; and
the first metal plane and the second metal plane are configured to create a second interconnect inductance less that the first interconnect inductance, in response to the voltage differential between the first metal plane and the second metal plane.

3. The electronic device of clause 2, wherein a ratio of the first interconnect inductance to the second interconnect inductance is at least 10.0.

4. The electronic device of any of clauses 1-3, wherein the second metal plane is coupled to a third metal plane in the second metal layer.

5. The electronic device of clause 4, wherein:
The first metal plane is configured to be coupled to a first power signal of a power source to carry the first power signal; and
the second metal plane is configured to be coupled to a second power signal of the power source to carry the second power signal.

6. The electronic device of any of clauses 1-5, wherein:
the first dielectric layer between the first metal layer and the second metal layer has a first height in a second direction orthogonal to the first direction; and
the second metal plane is disposed a first distance in the second direction from the second metal layer,
the first distance is less than the first height.

7. The electronic device of clause 6, wherein the second metal plane is disposed a second distance in the second direction from the first metal layer,
the first distance is less than the second distance.

8. The electronic device of clause 6 or 7, wherein:
the first height is between fifty (50) micrometers (μm) and seventy (70) μm; and
the first distance is between 1.0 μm and 5.0 μm.

9. The electronic device of any of clauses 6-8, wherein a ratio between the first height and the first distance is at least 10.0.

10. The electronic device of any of clauses 1-5, wherein:
the first dielectric layer between the first metal layer and the second metal layer has a first height; and
the second metal plane is disposed a first distance from the first metal layer, the first distance is less than the first height.

11. The electronic device of clause 10, wherein the second metal plane is disposed a second distance from the second metal layer in a second direction orthogonal to the first direction,
the first distance is less than the second distance.

12. The electronic device of clause 10 or 11, wherein:
the first height is between fifty (50) micrometers (μm) and seventy (70) μm; and
the first distance is between 1.0 μm and 5.0 μm.

13. The electronic device of any of clauses 10-12, wherein a ratio between the first height and the first distance is at least 10.0.

14. The electronic device of any of clauses 1-13, further comprising an IC package;
wherein:
the routing substrate comprises a circuit board;
the IC package is coupled to the circuit board; and
the IC package comprises a package substrate comprising a first metal line coupled to the first metal plane and a second metal line coupled to the second metal plane; and
further comprising a die coupled to the first metal line and the second metal line.

15. The electronic device of clause 14, wherein:
the plurality of metallization layers are disposed in a first plane; and
the package substrate and the capacitor do not share a common second plane orthogonal to the first plane.

16. The electronic device of any of clauses 1-13, comprising an IC package, comprising:
a package substrate comprising the routing substrate; and
a die electrically coupled to the first metal plane and the second metal plane of the package substrate.

17. The electronic device of clause 16, wherein:
the plurality of metallization layers are disposed in a first plane; and
the die and the capacitor do not share a common second plane orthogonal to the first plane.

18. The electronic device of any of clauses 1-17, wherein the capacitor comprises a deep trench capacitor (DTC).

19. The electronic device of any of clauses 1-18, wherein:
the plurality of metallization layers are disposed in a first plane; and
further comprising:
a second capacitor coupled to the routing substrate;
a die electrically coupled to the first metal plane and the second metal plane of the routing substrate; and
the die and the second capacitor sharing a common second plane orthogonal to the first plane.

20. The electronic device of any of clauses 1-19 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics systems; a drone; and a multicopter.

21. A method of fabricating an electronic device, comprising:
forming a routing substrate comprising a plurality of metallization layers parallel to each other in a first direction, comprising:
forming a first metallization layer, comprising:
forming a first metal layer comprising a first metal plane; and
forming a first dielectric layer adjacent to the first metal layer;

forming a second metallization layer, comprising:
    forming a second metal layer; and
    forming a second dielectric layer adjacent to the second metal layer;
forming a second metal plane in the first dielectric layer of the first metallization layer; and
coupling the second metallization layer to the first metallization layer such that the second metal plane is between the first metal layer and the second metal layer in a second direction orthogonal to the first direction; and
coupling a capacitor to the routing substrate, comprising:
    coupling the capacitor to the first metal plane and the second metal plane.

22. The method of clauses 21, further comprising coupling the second metal plane to a third metal plane in the second metal layer.

23. The method of clause 21 or 22, wherein:
the first dielectric layer between the first metal layer and the second metal layer has a first height in the second direction; and
forming the second metal plane further comprises forming the second metal plane a first distance in the second direction from the second metal layer, and the first distance is less than the first height.

24. The method of clause 23, wherein forming the second metal plane further comprises forming the second metal plane a second distance in the second direction from the first metal layer, and
the first distance is less than the second distance.

25. The method of clause 21 or 22, wherein:
the first dielectric layer between the first metal layer and the second metal layer has a first height; and
forming the second metal plane further comprises forming the second metal plane a first distance from the first metal layer, and the first distance is less than the first height.

26. The method of clause 25, wherein forming the second metal plane further comprises forming the second metal plane a second distance from the second metal layer in the second direction from the second metal layer, and
the first distance is less than the second distance.

27. The method of any of clauses 21-26, further comprising coupling a die to the first metal plane and the second metal plane.

28. The method of clause 27, wherein:
the plurality of metallization layers are disposed in a first plane; and
the die and the capacitor do not share a common second plane orthogonal to the first plane.

What is claimed is:
1. An electronic device, comprising:
a routing substrate comprising a plurality of metallization layers parallel to each other in a first direction, the plurality of metallization layers comprising:
    a first metallization layer, comprising:
        a first metal layer comprising a first metal plane; and
        a first dielectric layer adjacent to the first metal layer;
    a second metallization layer adjacent to the first metallization layer, the second metallization layer comprising:
        a second metal layer; and
        a second dielectric layer adjacent to the second metal layer, the second dielectric layer between the first metal layer and the second metal layer in a second direction orthogonal to the first direction; and
        a second metal plane disposed in the second dielectric layer, the second metal plane between the first metal layer and the second metal layer in the second direction; and
a capacitor coupled to the first metal plane and the second metal plane;
wherein:
    the second metal plane is disposed a first distance from the first metal layer in the second direction;
    the second metal plane is disposed a second distance in the second direction from the second metal layer; and
    the first distance is less than the second distance.

2. The electronic device of claim 1, wherein:
the first metal plane and the second metal layer are configured to create a first interconnect inductance in response to a voltage differential between the first metal plane and the second metal layer; and
the first metal plane and the second metal plane are configured to create a second interconnect inductance less than the first interconnect inductance, in response to the voltage differential between the first metal plane and the second metal plane.

3. The electronic device of claim 2, wherein a ratio of the first interconnect inductance to the second interconnect inductance is at least 10.0.

4. The electronic device of claim 1, wherein the second metal plane is coupled to a third metal plane in the second metal layer.

5. The electronic device of claim 4, wherein:
the first metal plane is configured to be coupled to a first power signal of a power source to carry the first power signal; and
the second metal plane is configured to be coupled to a second power signal of the power source to carry the second power signal.

6. The electronic device of claim 1, wherein:
the second dielectric layer has a first height in the second direction; and
the first distance is less than the first height.

7. The electronic device of claim 6, wherein:
the first height is between fifty (50) micrometers (μm) and seventy (70) μm; and
the first distance is between 1.0 μm and 5.0 μm.

8. The electronic device of claim 6, wherein a ratio between the first height and the first distance is at least 10.0.

9. The electronic device of claim 1, wherein:
the second metal plane has a second height in the second direction; and
the second distance is less than the second height.

10. The electronic device of claim 9, wherein:
the second height is between fifty (50) micrometers (μm) and seventy (70) μm; and
the second distance is between 1.0 μm and 5.0 μm.

11. The electronic device of claim 9, wherein a ratio between the second height and the second distance is at least 10.0.

12. The electronic device of claim 1, further comprising an integrated circuit (IC) package;
wherein:
    the routing substrate comprises a circuit board;
    the IC package is coupled to the circuit board; and
    the IC package comprises a package substrate comprising a first metal line coupled to the first metal plane and a second metal line coupled to the second metal plane; and further comprising a die coupled to the first metal line and the second metal line.

13. The electronic device of claim 12, wherein:
the plurality of metallization layers are disposed in a first plane; and
the package substrate and the capacitor do not share a common second plane orthogonal to the first plane.

14. The electronic device of claim 1, comprising an integrated circuit (IC) package, comprising:
a package substrate comprising the routing substrate; and
a die electrically coupled to the first metal plane and the second metal plane of the package substrate.

15. The electronic device of claim 14, wherein:
the plurality of metallization layers are disposed in a first plane; and
the die and the capacitor do not share a common second plane orthogonal to the first plane.

16. The electronic device of claim 1, wherein the capacitor comprises a deep trench capacitor (DTC).

17. The electronic device of claim 1, wherein:
the plurality of metallization layers are disposed in a first plane; and
further comprising:
a second capacitor coupled to the routing substrate;
a die electrically coupled to the first metal plane and the second metal plane of the routing substrate; and
the die and the second capacitor share a common second plane orthogonal to the first plane.

18. The electronic device of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics systems; a drone; and a multicopter.

19. A method of fabricating an electronic device, comprising:
forming a routing substrate comprising a plurality of metallization layers parallel to each other in a first direction, comprising:
forming a first metallization layer, comprising:
forming a first metal layer comprising a first metal plane; and
forming a first dielectric layer adjacent to the first metal layer;
forming a second metallization layer, comprising:
forming a second metal layer; and
forming a second dielectric layer adjacent to the second metal layer, the second dielectric layer between the first metal layer and the second metal layer in a second direction orthogonal to the first direction;
forming a second metal plane in the second dielectric layer of the second metallization layer; and
coupling the second metallization layer to the first metallization layer such that the second metal plane is between the first metal layer and the second metal layer in the second direction; and
coupling a capacitor to the routing substrate, comprising:
coupling the capacitor to the first metal plane and the second metal plane;
wherein:
the second metal plane is disposed a first distance from the first metal layer in the second direction;
the second metal plane is disposed a second distance in the second direction from the second metal layer; and
the first distance is less than the second distance.

20. The method of claim 19, further comprising coupling the second metal plane to a third metal plane in the second metal layer.

21. The method of claim 19, wherein:
the second dielectric layer has a first height in the second direction; and
the first distance is less than the first height.

22. The method of claim 19, wherein:
the second metal plane has a second height in the second direction; and
the second distance is less than the second height.

23. The method of claim 19, further comprising coupling a die to the first metal plane and the second metal plane.

24. The method of claim 23, wherein:
the plurality of metallization layers are disposed in a first plane; and
the die and the capacitor do not share a common second plane orthogonal to the first plane.

25. The method of claim 21, wherein:
the first height is between fifty (50) micrometers (μm) and seventy (70) μm; and
the first distance is between 1.0 μm and 5.0 μm.

26. The method of claim 21, wherein a ratio between the first height and the first distance is at least 10.0.

27. The method of claim 22, wherein:
the second height is between fifty (50) micrometers (μm) and seventy (70) μm; and
the second distance is between 1.0 μm and 5.0 μm.

28. The electronic device of claim 22, wherein a ratio between the second height and the second distance is at least 10.0.

* * * * *